(12) United States Patent
Xu et al.

(10) Patent No.: US 12,707,813 B2
(45) Date of Patent: Aug. 11, 2026

(54) DISPLAY PANEL AND TERMINAL DEVICE

(71) Applicants: Chengdu BOE Optoelectronics Technology Co., Ltd., Sichuan (CN); BOE Technology Group Co., Ltd., Beijing (CN)

(72) Inventors: Yuanjie Xu, Beijing (CN); Taofeng Xie, Beijing (CN); Tingliang Liu, Beijing (CN); Yue Long, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 499 days.

(21) Appl. No.: 18/245,352

(22) PCT Filed: Jun. 29, 2022

(86) PCT No.: PCT/CN2022/102397
§ 371 (c)(1),
(2) Date: Mar. 15, 2023

(87) PCT Pub. No.: WO2024/000275
PCT Pub. Date: Jan. 4, 2024

(65) Prior Publication Data

US 2024/0298468 A1 Sep. 5, 2024

(51) Int. Cl.
*H10K 59/121* (2023.01)
*H10K 59/131* (2023.01)
(Continued)

(52) U.S. Cl.
CPC ..... *H10K 59/1213* (2023.02); *H10K 59/1216* (2023.02); *H10K 59/131* (2023.02); *H10K 59/353* (2023.02); *H10K 59/65* (2023.02)

(58) Field of Classification Search
CPC ........... H10K 59/1213; H10K 59/1216; H10K 59/131; H10K 59/353; H10K 59/65; H10K 59/121; G09F 9/302
See application file for complete search history.

(56) References Cited

U.S. PATENT DOCUMENTS

2019/0326366 A1* 10/2019 Fan ..................... H10K 59/353
2020/0066809 A1 2/2020 Liu
(Continued)

FOREIGN PATENT DOCUMENTS

CN 108428729 A 8/2018
CN 109950288 A 6/2019
(Continued)

OTHER PUBLICATIONS

Written Opinion from PCT/CN2022/102397 dated Dec. 21, 2022.
Office action from Chinese Application No. 202280002007.X dated Jun. 9, 2026.

*Primary Examiner* — Elmito Breval
(74) *Attorney, Agent, or Firm* — Calfee, Halter & Griswold LLP

(57) ABSTRACT

A display panel includes more than one light transmitting region and a display region; the light transmitting region includes a first light transmitting region and a second light transmitting region; the display panel includes more than one first pixel unit located in the display region and more than one second pixel unit, any second pixel unit is at least partially located in the light transmitting region, and the part of the second pixel unit located in the light transmitting region is a functional part; the first light transmitting region and the second light transmitting region both include n sub-region groups arranged along a first direction, and each sub-region group includes m sub-regions arranged along a second direction; only one of the j-th sub-region in the i-th sub-region group in the first light transmitting region and the
(Continued)

second light transmitting region is provided with a functional part.

20 Claims, 12 Drawing Sheets

(51) Int. Cl.
*H10K 59/35* (2023.01)
*H10K 59/65* (2023.01)

(56) References Cited

U.S. PATENT DOCUMENTS

| | | | |
|---|---|---|---|
| 2020/0395418 | A1 | 12/2020 | Han |
| 2021/0208633 | A1 | 7/2021 | Ma |
| 2021/0376004 | A1 | 12/2021 | Li |
| 2022/0013598 | A1 | 1/2022 | Park |
| 2022/0035408 | A1 | 2/2022 | Ma |
| 2022/0085118 | A1 | 3/2022 | Han |

FOREIGN PATENT DOCUMENTS

| | | | |
|---|---|---|---|
| CN | 110024366 | A | 7/2019 |
| CN | 110047386 | A | 7/2019 |
| CN | 110071161 | A | 7/2019 |
| CN | 110112189 | A | 8/2019 |
| CN | 111028765 | A | 4/2020 |
| CN | 111290153 | A | 6/2020 |
| CN | 111834425 | A | 10/2020 |
| CN | 111885286 | A | 11/2020 |
| CN | 112072000 | A | 12/2020 |
| CN | 113299692 | A | 8/2021 |
| CN | 113437123 | A | 9/2021 |
| CN | 113612880 | A | 11/2021 |
| CN | 114141821 | A | 3/2022 |
| JP | 2010230797 | A | 10/2010 |
| WO | 2019062236 | A1 | 4/2019 |
| WO | 2020186375 | A1 | 9/2020 |

* cited by examiner

DISPLAY PANEL AND TERMINAL DEVICE

CROSS REFERENCE

The present disclosure is a National Stage of International Application No. PCT/CN2022/102397, filed on Jun. 29, 2022, and the entire contents of which are incorporated herein by reference.

TECHNICAL FIELD

The present disclosure relates to the field of display technology, and in particular, to a display panel and a terminal device.

BACKGROUND

For the screen of a terminal device with a camera, such as a mobile phone and a tablet computer, the region of the screen corresponding to the camera generally needs an opening, so that it cannot emit light, which is not conducive to increasing the screen-to-body ratio.

It should be noted that the information disclosed in the above background section is only for enhancing the understanding of the background of the present disclosure, and therefore may include information that does not constitute the related art known to those of ordinary skill in the art.

SUMMARY

The present disclosure provides a display panel and a terminal device.

According to an aspect of the present disclosure, there is provided a display panel, the display panel is provided with more than one light transmitting region and a display region located outside the more than one light transmitting region; the light transmitting region includes a first light transmitting region and a second light transmitting region;

the display panel includes:

a substrate;

more than one pixel unit, provided on a side of the substrate and including more than one first pixel unit and more than one second pixel unit; where, the first pixel unit is located in the display region, any second pixel unit is at least partially located in the light transmitting region, and a part of the second pixel unit located in the light transmitting region is a functional part; the first light transmitting region and the second light transmitting region are both provided with more than one functional part;

where, the first light transmitting region and the second light transmitting region both include n sub-region groups arranged along a first direction, and each sub-region group includes m sub-regions arranged along a second direction, and the first direction intersects the second direction;

only one of a j-th sub-region in an i-th sub-region group in the first light transmitting region and the second light transmitting region is provided with the functional part, $i \leq n$, $j \leq m$, m and n are both positive integers.

In at least one embodiment of the present disclosure, the functional part in the first light transmitting region is located in an odd number of sub-region groups, and the functional part in the second light transmitting region is located in an even number of sub-region groups.

In at least one embodiment of the present disclosure, at least one sub-region group includes a first sub-subregion group and a second sub-subregion group arranged along the first direction, the first sub-subregion group and the second sub-subregion group both include more than one sub-region arranged along the second direction;

each functional part in the sub-region group is provided in the sub-regions of the first sub-subregion group and the second sub-region group, and the sub-regions of the first sub-subregion group and the second sub-subregion group are both provided with the functional part.

In at least one embodiment of the present disclosure, each sub-region group includes a first sub-subregion group and a second sub-subregion group arranged along the first direction, and the first sub-subregion group and the second sub-subregion group both include more than one sub-region arranged along the second direction;

each functional part in the sub-region group is provided in the sub-regions of the first sub-subregion group and the second sub-subregion group, and the functional part of the first sub-subregion group is distributed at intervals, the functional part of the second sub-subregion group is distributed at intervals.

In at least one embodiment of the present disclosure, in the second direction, the functional part of the first sub-subregion group is distributed alternately with the functional part of the second sub-subregion group.

In at least one embodiment of the present disclosure, in the first direction, the functional part of the first sub-subregion group is provided in one-to-one correspondence with the functional part of the second sub-subregion group.

In at least one embodiment of the present disclosure, the functional part of the first sub-subregion group and the second sub-subregion group in the first light transmitting region is provided in an odd number of sub-regions, and the functional part of the first sub-subregion group and the second sub-subregion group in the second light transmitting region is provided in an even number of sub-regions.

In at least one embodiment of the present disclosure, the sub-regions of the sub-region group provided with the functional part are arranged in at least two rows along the second direction, and two adjacent rows of the sub-regions are staggered in the first direction.

In at least one embodiment of the present disclosure, a shape of a sub-region is a parallelogram with two sides extending along the first direction and two sides forming a specified included angle with the second direction, and the specified included angle is an acute angle.

In at least one embodiment of the present disclosure, the pixel unit includes a pixel circuit and a light emitting element provided along a direction away from the substrate, and the pixel circuit is used to drive the light emitting element to emit light; a pixel circuit and a light emitting element of the first pixel unit are both located in the display region, and a pixel circuit and a light emitting element of the second pixel unit are both located in the light transmitting region; the second pixel unit is the functional part.

In at least one embodiment of the present disclosure, in the second direction, a length of at least part of the sub-regions in the light transmitting region is smaller than a length of the pixel unit in the display region.

In at least one embodiment of the present disclosure, in the first direction, a width of at least part of the sub-regions in the light transmitting region is smaller than a length of the pixel unit in the display region.

In at least one embodiment of the present disclosure, the pixel unit includes a pixel circuit and a light emitting element provided along a direction away from the substrate, and the pixel circuit is used to drive the light emitting element to emit light;

a pixel circuit of the second pixel unit is located in the display region, a light emitting element of the second pixel unit is the functional part, and the functional part is connected to the pixel circuit through a conductive line.

In at least one embodiment of the present disclosure, a width of a part of a pixel circuit of the first pixel unit in the second direction is smaller than a width of another part of the pixel circuit of the first pixel unit in the second direction.

In at least one embodiment of the present disclosure, the conductive line is provided between the pixel circuit and the light emitting element, and extends from the light transmitting region to the display region.

In at least one embodiment of the present disclosure, a j-th sub-region in an i-th sub-region group of the first light transmitting region is provided with the functional part, and a j-th sub-region in an i-th sub-region group of the second light transmitting region is a transmission region.

According to an aspect of the present disclosure, there is provided a display panel, the display panel is provided with more than one light transmitting region and a display region located outside the light transmitting region; the light transmitting region includes a first light transmitting region and a second light transmitting region;

the display panel includes:

a substrate;

more than one pixel unit, provided on a side of the substrate and including more than one first pixel unit and more than one second pixel unit; where, the first pixel unit is located in the display region, any second pixel unit is at least partially located in the light transmitting region, and a part of the second pixel unit located in the light transmitting region is a functional part; the first light transmitting region and the second light transmitting region are both provided with more than one functional part;

where, the first light transmitting region and the second light transmitting region both include more than one sub-region, and the sub-region of the first light transmitting region and the sub-region in the second light transmitting region are both arranged in a same manner; the functional part in the light transmitting region is located in a part of the sub-region;

in the first light transmitting region and the second light transmitting region, only one of two sub-regions arranged at a same position is provided with the functional part.

In at least one embodiment of the present disclosure, in the first direction, a length of at least part of the sub-region in the light transmitting region is smaller than a length of the first pixel unit in the display region.

In at least one embodiment of the present disclosure, the light transmitting region includes more than one sub-region group extending along a second direction, and each of the sub-region group is distributed along a first direction; each of the sub-region group includes more than one the sub-region distributed along the second direction.

In at least one embodiment of the present disclosure, in the first direction, a width of the sub-region group is the same as the length of the first pixel unit in the display region, and a length of sub-region group is not greater than 50% of the length of the first pixel unit in the display region;

sub-regions in a same sub-region group are arranged in at least two rows along the first direction.

In at least one embodiment of the present disclosure, only at least part of the sub-region of a (2n−1)-th sub-region group in the first light transmitting region is provided with the functional part;

only at least part of the sub-region of a 2n-th sub-region group in the second light transmitting region is provided with the functional part; and n is a positive integer.

In at least one embodiment of the present disclosure, in a sub-region group provided with the functional part, two sub-regions at least partially adjacent in the first direction are provided with the function part.

In at least one embodiment of the present disclosure, each sub-region group in any light transmitting region is provided with the functional part, and each row of sub-regions in a same sub-region group are provided with the functional part at intervals.

In at least one embodiment of the present disclosure, in a sub-region group provided with the functional part, at most one of two sub-regions adjacent in the first direction is provided with the functional part.

In at least one embodiment of the present disclosure, in a row of the sub-regions provided with the functional part of the first light transmitting region, the functional part is provided in a (2n−1)-th sub-region;

in a row of the sub-regions provided with the functional part of the second light transmitting region, the functional part is provided in a 2n-th sub-region.

In at least one embodiment of the present disclosure, only at least part of the sub-region of a (2n−1)-th sub-region group in the first light transmitting region is provided with the functional part; only at least part of the sub-region of a 2n-th sub-region group in the second light transmitting region is provided with the functional part; and n is a positive integer;

sub-regions in a same sub-region group are arranged in at least two rows along the first direction, and two adjacent rows of the sub-regions partially overlap with each other in the second direction.

In at least one embodiment of the present disclosure, a shape of the sub-region is a parallelogram with two sides extending along the second direction and two sides forming a specified included angle with the first direction, and the specified included angle is an acute angle.

In at least one embodiment of the present disclosure, in the second direction, a width of at least part of the sub-region in the light transmitting region is smaller than the length of the first pixel unit in the display region.

In at least one embodiment of the present disclosure, the light transmitting region includes more than one sub-region group extending along the first direction, and each sub-region group is distributed along the second direction; each sub-region group includes more than one sub-region distributed along the first direction;

only at least part of the sub-region of a (2n−1)-th sub-region group in the first light transmitting region is provided with the functional part;

only at least part of the sub-region of a 2n-th sub-region group in the second light transmitting region is provided with the functional part; and n is a positive integer.

In at least one embodiment of the present disclosure, in the second direction, a width of the sub-region in the light transmitting region is not greater than 50% of a width of the first pixel unit in the display region, and sub-regions in a same sub-region group are arranged in at least two columns along the second direction.

In at least one embodiment of the present disclosure, the pixel unit includes a pixel circuit and a light emitting element provided along a direction away from the substrate, and the pixel circuit is used to drive the light emitting element to emit light; a pixel circuit and a light emitting element of the first pixel unit are both located in the display region, and a pixel circuit and a light emitting element of the second pixel unit are both located in the light transmitting region; and the second pixel unit is the functional part.

In at least one embodiment of the present disclosure, the display panel further includes a signal line extending along the second direction and passing through the light transmitting region, the signal line is connected to at least one row of pixel circuits in the display region and at least one row of the pixel circuits in the light transmitting region.

In at least one embodiment of the present disclosure, at least one signal line is provided with a bending part bent along the first direction, the bending part is located in the light transmitting region and is connected to at least one row of pixel circuits in the light transmitting region.

In at least one embodiment of the present disclosure, the pixel unit includes a pixel circuit and a light emitting element provided along a direction away from the substrate, and the pixel circuit is used to drive the light emitting element to emit light;

a pixel circuit of the second pixel unit is located in the display region, a light emitting element of the second pixel unit is the functional part, and the functional part is connected to the pixel circuit through a conductive line.

According to an aspect of the present disclosure, there is provided a terminal device, including:

the display panel according to any one of the above;

a light-sensing element, located on a side of the substrate away from the more than one pixel unit, and an orthographic projection of the light-sensing element on the substrate at least partially overlaps with an orthographic projection of the light transmitting region on the substrate.

In at least one embodiment of the present disclosure, the light-sensing element includes a first light-sensing element and a second light-sensing element, and an orthographic projection of the first light-sensing element on the substrate at least partially overlaps with an orthographic projection of the first light transmitting region on the substrate;

an orthographic projection of the second light-sensing element on the substrate at least partially overlaps with an orthographic projection of the second light transmitting region on the substrate.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the description, illustrate embodiments consistent with the present disclosure and serve to explain the principles of the present disclosure together with the description. Apparently, the drawings in the following description are only some embodiments of the present disclosure, and those skilled in the art can obtain other drawings according to these drawings without creative efforts.

DETAILED DESCRIPTION

Figure 1:
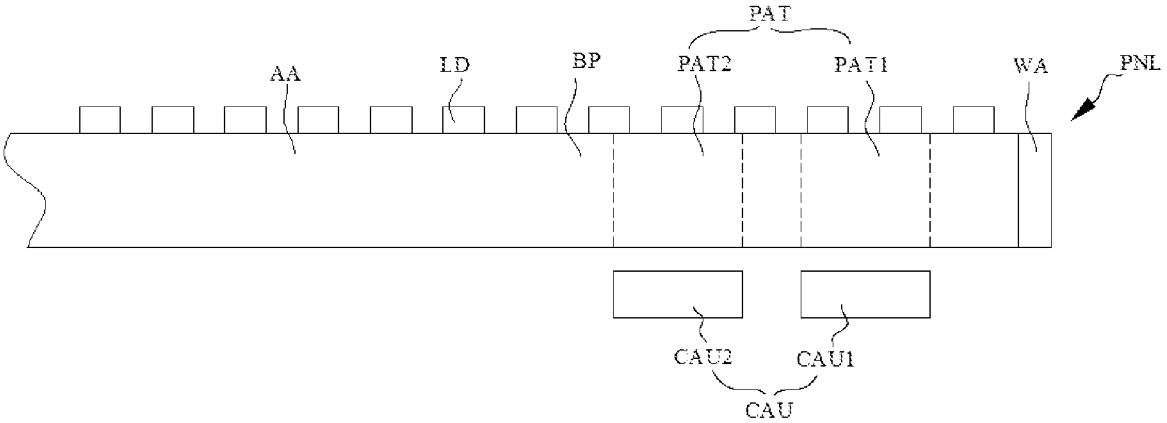
FIG. 1 is a schematic diagram of the terminal device according to some embodiments of the present disclosure.

Example embodiments will now be described more fully with reference to the accompanying drawings. Example embodiments may, however, be embodied in many forms and should not be construed as limited to the embodiments set forth here; on the contrary, these embodiments are provided so that the present disclosure will be thorough and complete, and will fully convey the concept of example embodiments to those skilled in the art. The same reference numbers in the drawings denote the same or similar structures, and thus their detailed descriptions will be omitted. Furthermore, the drawings are merely schematic illustrations of the present disclosure and are not necessarily drawn to scale.

The terms “a”, “an”, “the”, “said” and “at least one” are used to indicate the presence of one or more elements/components/etc.; the terms “comprising” and “including” are used to indicate the meaning of open inclusion and refer to the existence of other elements/components/etc., in addition to the listed elements/components/etc.; the terms “first”, “second” and “third” etc., are only ssed as a marker, not a limit on the number of its objects.

The first direction Y and the second direction X here are only two directions intersecting with each other. In the drawings of the present disclosure, the first direction Y may be a longitudinal direction, and the second direction X may be a transverse direction, but it is not limited to this. If the display panel is rotated, the actual orientations of the first direction Y and the second direction X may change.

At present, although there is an under-screen camera technology, in which the region where the camera is located can also display images, the opening can be avoided, and a shot can be taken normally, the display effect of the under-screen camera region and the imaging quality after shooting need to be improved.

Figure 2:
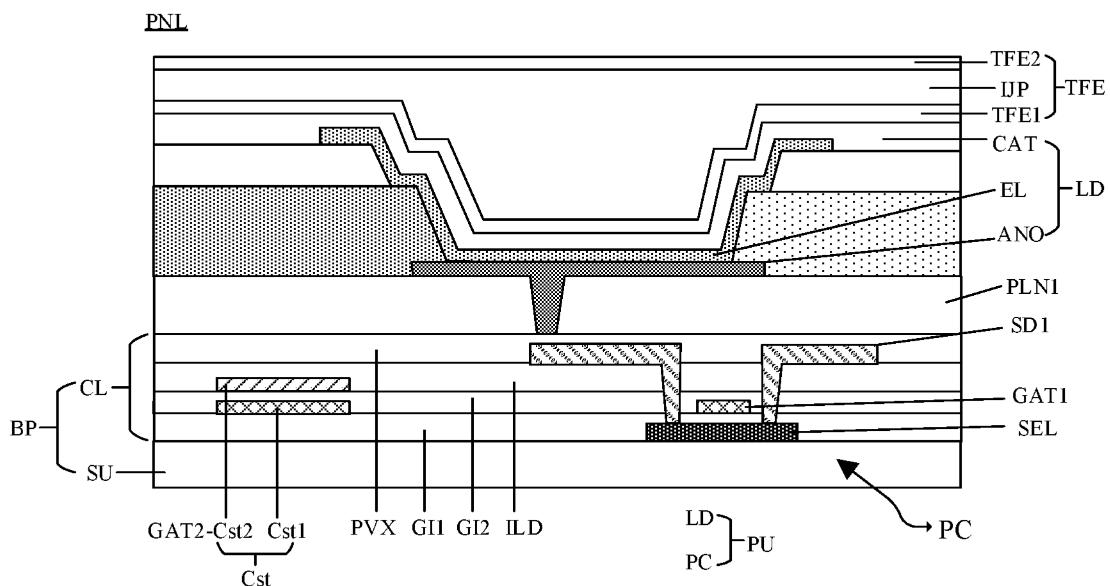
FIG. 2 is a partial schematic cross-sectional diagram of the display panel according to some embodiments of the present disclosure.
Figure 3:
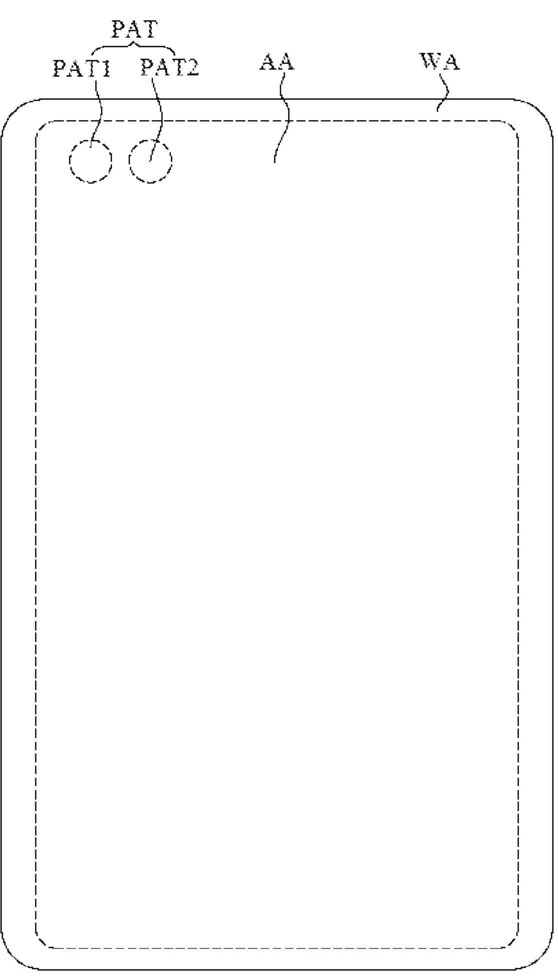
FIG. 3 is a top view of the display panel according to some embodiments of the present disclosure.

As shown in FIG. 2 and FIG. 3, the display panel PNL according to the embodiments of the present disclosure can be at least divided into a display region AA that can emit light and a peripheral region WA outside the display region AA, the peripheral region WA does not emit light. Meanwhile, the display panel PNL may include a substrate SU and pixel units.

The substrate SU can be a flexible transparent material such as polyimide, or a hard transparent material such as glass, and the substrate SU can be a multi-layer or single-layer structure.

Each pixel unit can be distributed in an array on a side of the substrate SU, and each pixel unit can emit light independently to display images. Each pixel unit may include a pixel circuit and a light emitting element LD. The light emitting element LD is provided on a side of the pixel circuit away from the substrate SU and connected to the pixel circuit. The light emitting element LD can be controlled to emit light through the pixel circuit. The LD can be an OLED (Organic Light Emitting Diode), a QLED (Quantum Dot Light Emitting Diode), a Micro LED or a Mini LED, etc., which can include the first electrode ANO, the second electrode CAT and the light emitting layer EL between the first electrode ANO and the second electrode CAT.

As shown in FIG. 2 and FIG. 3, each pixel circuit PC can be located on a circuit layer CL, and the circuit layer CL can form a driving backplate BP with the substrate SU. The circuit layer CL may further include a peripheral circuit located within the peripheral region WA. On one hand, the peripheral circuit can be connected to the light emitting element LD through the pixel circuit, and control the current passing through the light emitting element LD by controlling the pixel circuit, thus controlling the brightness of the light emitting element LD. The pixel circuit and light emitting element are described in detail below.

The pixel circuit may include more than one transistor, and may also include a capacitor; the pixel circuit may be a pixel circuit such as 3T1C, 7T1C, etc. nTmC means that a pixel circuit includes n transistors (indicated by the letter "T") and m capacitors (indicated by the letter "C"). Taking the 7T1C pixel circuit as an example, it may include 7 transistors and 1 capacitor, that is, the first reset transistor T1, the compensation transistor T2, the driving transistor T3, the writing transistor T4, the first light emitting control transistor T5, the second light emitting control transistor T6, the second reset transistor T7 and the storage capacitor Cst.

Figure 4:
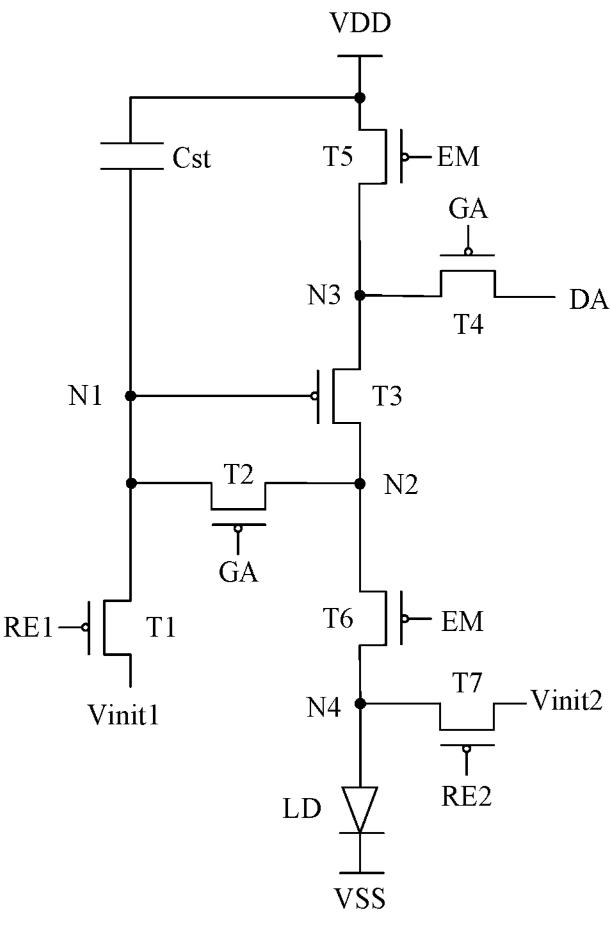
FIG. 4 is a principle diagram of the pixel circuit in the display panel according to some embodiments of the present disclosure.

As shown in FIG. 4, the first electrode of the first reset transistor T1 is connected to the first reset signal line VIL1, for receiving the reset signal Vinit1, and the second electrode is connected to the gate of the driving transistor T3 and the first electrode plate of the storage capacitor Cst. The first electrode of the compensation transistor T2 is connected to the second electrode of the driving transistor T3, and the second electrode is connected to the gate of the driving transistor T3. The first electrode of the writing transistor T4 is connected to the data line DL, for receiving the data signal Data, and the second electrode is connected to the first electrode of the driving transistor T3. The first electrode of the first light emitting control transistor T5 and the second electrode plate of the storage capacitor Cst are connected to the power line VDL, for receiving the first power signal VDD, and the second electrode is connected to the first electrode of the driving transistor T3. The first electrode of the second light emitting control transistor T6 is connected to the second electrode of the driving transistor T3, and the second electrode is connected to the first electrode of the light emitting element. The first electrode of the second reset transistor T7 is connected to the second reset signal line VIL2, for receiving the second reset signal Vinit2, and the second electrode is connected to the second electrode of the second light emitting control transistor T6. The second electrode of the light emitting element can receive the second power signal VSS.

At the same time, in order to control the turn-on and turn-off of each transistor, the gate of the first reset transistor T1 is connected to the first reset control line REL1 for inputting the first reset control signal RE1, and the gate of the second reset transistor T7 is connected to the second reset control line REL2 for inputting the second reset control signal RE2. The gates of the compensation transistor T2 and the writing transistor T4 are connected to the scanning line GL for inputting the scanning signal GA, and the gates of the first light emitting control transistor T5 and the second light emitting control transistor T6 are connected to the light emitting control line EML for inputting the light emitting control signal EM. The pixel circuit can be used to drive the connected light emitting elements to emit light in response to the signals provided by the connected signal ends.

The first reset signal line VIL1, the second reset signal line VIL2, the data line DL, the power line VDL, the first reset control line REL1, the second reset control line REL2, the scanning line GL and the light emitting control line EML all can be called as signal lines SL, and the signal line SL can extend along the second direction X or the first direction Y, for example, the data line DL and the power line VDL extend along the first direction Y, and other signal lines SL can extend along the second direction X.

In addition, transistors can be divided into N-type transistors and P-type transistors according to their characteristics. In the embodiments of the present disclosure, the transistors are P-type transistors as an example for description. Based on the description and teaching of the embodiments in the present disclosure, those skilled in the art can easily think of using N-type transistors for at least some of the transistors in the pixel circuit structure of the embodiments of the present disclosure, that is, using N-type transistors or combinations of N-type transistors and P-type transistors, without creative work. Therefore, these embodiments are also within the protection scope of the embodiments of the present disclosure.

Taking each transistor of the pixel circuit being a P-type low-temperature polysilicon transistor as an example, its working principle will be described below.

In the reset phase, the first reset control signal RE1 is a low-level signal, the first reset transistor T1 is turned on, the gate of the driving transistor T3 and the first electrode plate of the storage capacitor Cst are written with the reset signal Vinit1, initialization of N1 node is realized, and the influence of the data of the previous frame image is eliminated.

In the writing stage, with the scanning signal GA being a low-level signal, the writing transistor T4 and the compensation transistor T2 can be turned on, and the gate of the driving transistor T3 and the first electrode plate Cst1 of the storage capacitor Cst are written with the data signal DA, that is, the NI node is written with the data signal DA through the N3 node and the N2 node, until the potential reaches Vdata+vth. Among them, Vdata is the voltage of the data signal Da, and Vth is the threshold voltage of the driving transistor T3. The scanning signal GA of the writing transistor T4 and the compensating transistor T2 may be a same signal. At the same time, the second reset control signal RE2 is a low-level signal, so that the second reset transistor T7 is turned on, and the first electrode of the light emitting element LD and the second electrode of the second light emitting control transistor T6 are written with the second reset signal Vinit2, the N4 node is reset, initialization is realized, and the influence of the data of the previous frame image is further eliminated.

In the light emitting phase stage, the light emitting control signal EM is a low-level signal, the first light emitting control transistor T5 and the second light emitting control transistor T6 are turned on, and the driving transistor T3 is turned on under the action of the voltage Vdata+Vth stored in the storage capacitor Cst and the first power signal VDD, and at this time, the light emitting element LD emits light.

In some embodiments, as shown in FIG. 2 and FIGS. 14-18, the transistors and capacitors of the pixel circuit are all located on the circuit layer CL. Taking the transistor of the pixel circuit being a top-gate low-temperature polysilicon transistor as an example, the circuit layer CL can include a semiconductor layer SEL, a first gate insulation layer GI1, a first gate layer GAT1, a second gate insulation layer GI2, a second gate layer GAT2, a dielectric layer ILD, a first source-drain layer SD1, a passivation layer PVX and a first flat layer PLN1 stacked in sequence along direction away from the substrate.

Figure 15:
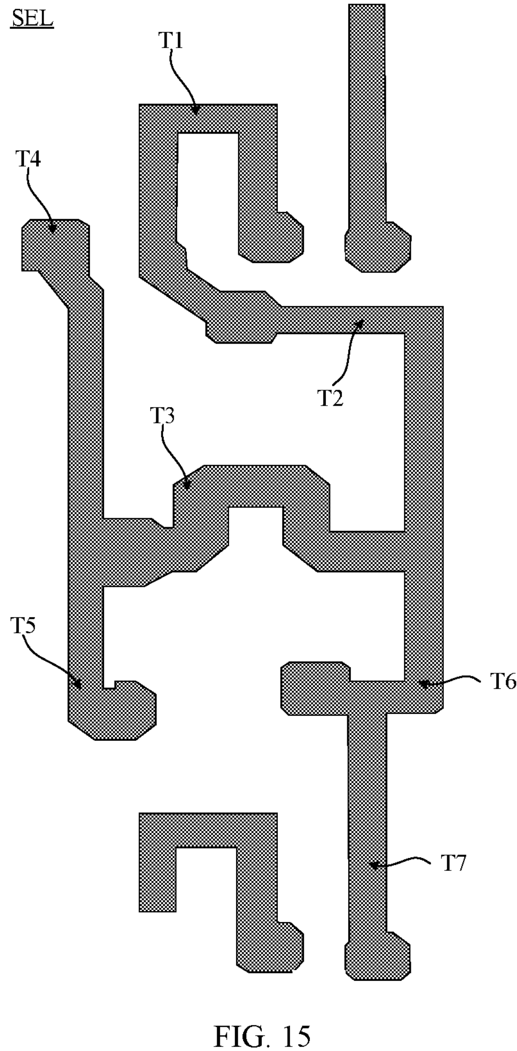
FIGS. 15-18 are schematic top views of part film layers of the pixel circuit in FIG. 14.

As shown in FIG. 15, the semiconductor layer SEL may include channels of transistors (T1-T7) and doping regions connecting at least part of the channels, and the connection of part of the transistors may be realized through the doping regions.

Figure 16:
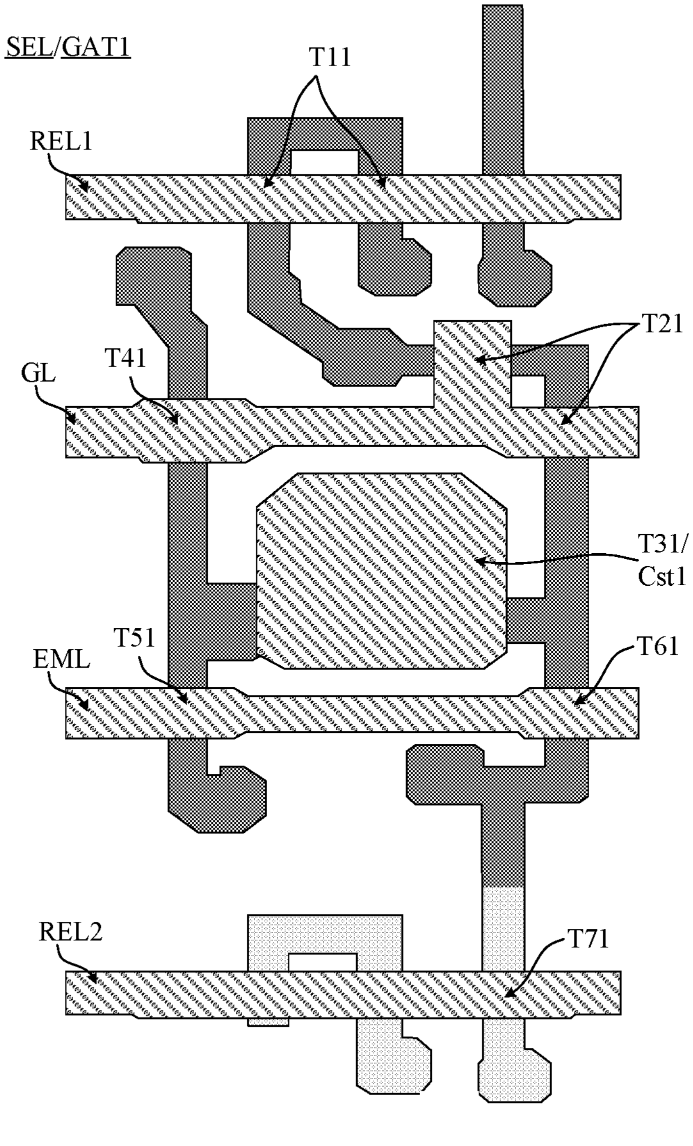

As shown in FIG. 16, the first gate layer GAT1 may include the first electrode plate Cst1 of the storage capacitor Cst and part of the signal lines SL (scanning line GL, first reset control line REL1, second reset control line REL2 and light emitting control line EML), and the overlapping region of these signal lines SL and the semiconductor layer SEL is the gate of each transistor. For example, the gate T11 of the first reset transistor T1 of the current row of pixel circuits, the gate of the second reset transistor T7 of the previous row of pixel circuits, and the first reset control line REL1 of the current row of pixel circuits can be an integral structure. The gate T21 of the compensation transistor T2, the gate T41 of the writing transistor T4 and the scanning line GL may be an integral structure. The gate T31 of the driving transistor T3 and the first electrode plate Cst1 of the storage capacitor Cst may be an integral structure. The gate T51 of the first light emitting control transistor T5, the gate T61 of the second light emitting control transistor T6 and the light emitting control line EML may be an integral structure. The gate T71 of the second reset transistor T7 of the current row of pixel circuits, the gate of the first reset transistor T1 of the next row of pixel circuits, and the second reset control line REL2 of the current row of pixel circuits may be an integral structure.

Figure 17:
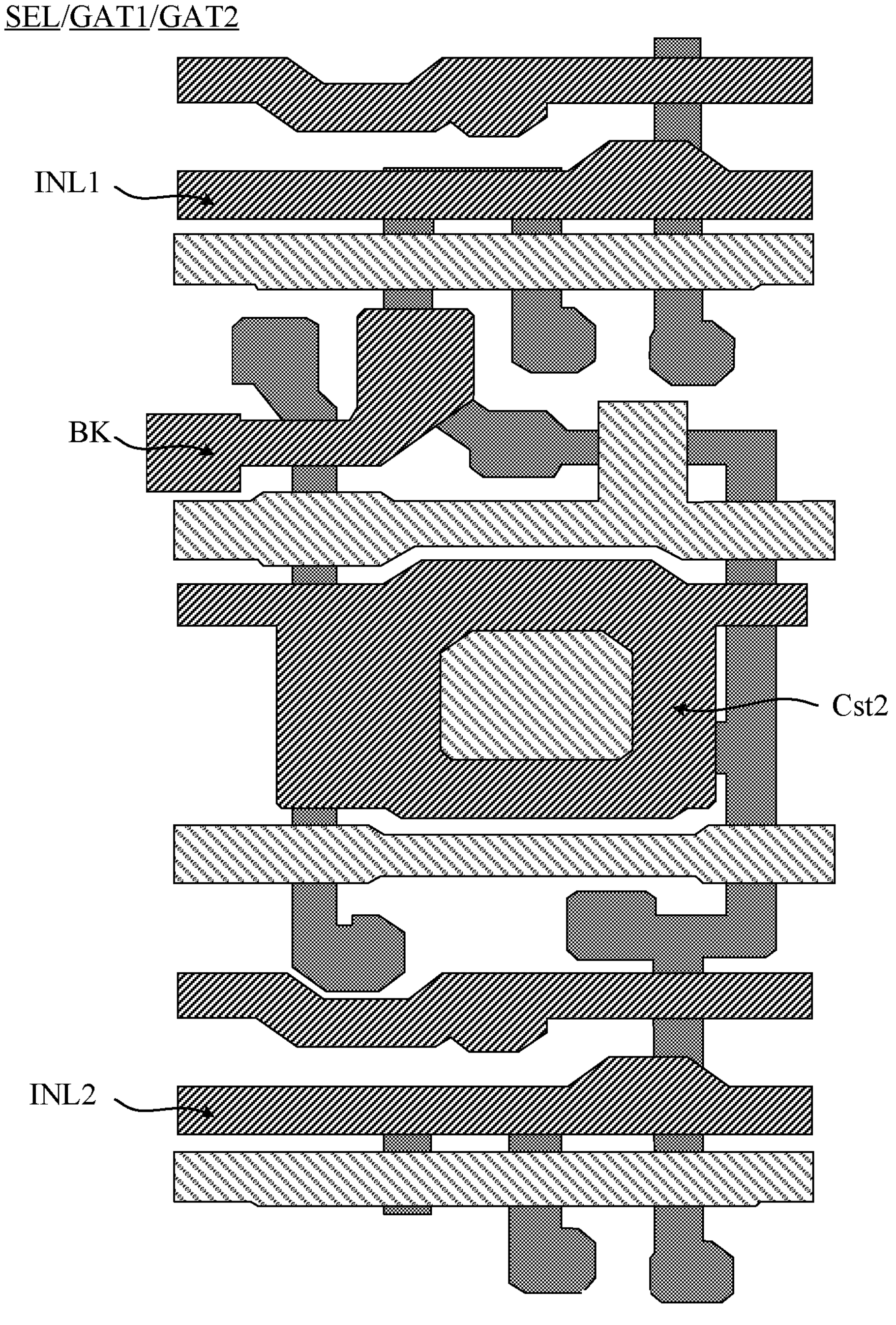

As shown in FIG. 17, the second gate layer GAT2 may include the second electrode plate Cst2 of the storage capacitor Cst and part of the signal lines SL (the first reset signal line VIL1 and the second reset signal line VIL2), the second gate layer GAT2 may also include a shielding electrode BK. The second electrode plate Cst2 of the storage capacitor Cst has a hollow region. The orthographic projection of the gate T31 of the driving transistor T3 on the substrate SU may cover the orthographic projection of the hollow region on the substrate SU. The orthographic projection of the hollow region on the substrate SU may be a polygon.

Figure 18:
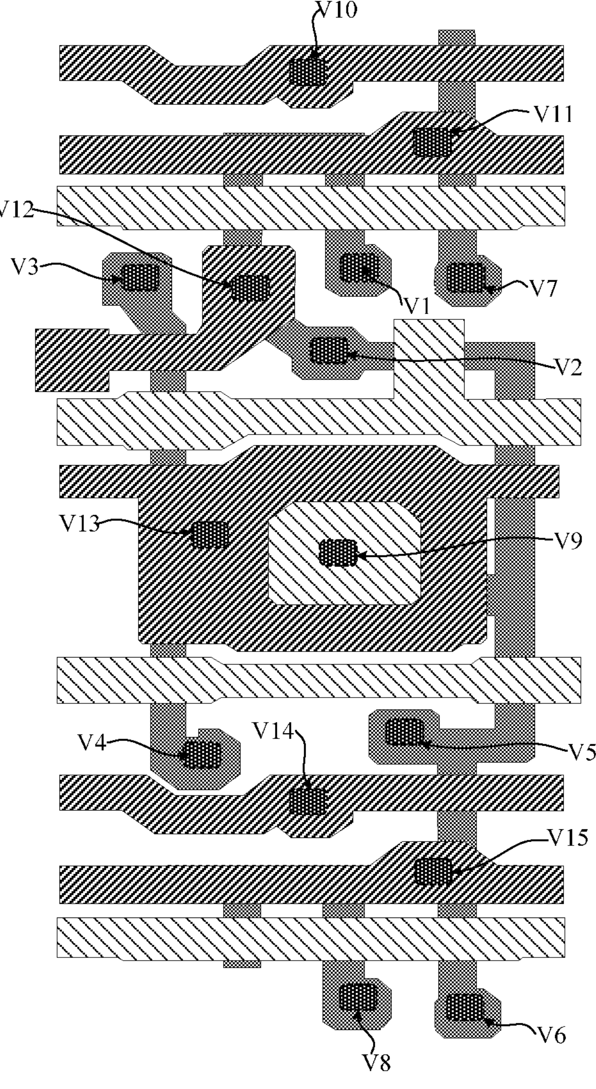

As shown in FIG. 18, the dielectric layer ILD is provided with more than one via hole, for example including a first via hole V1 to a fifteenth via hole V15. Among them, the dielectric layer ILD, the second gate insulation layer GI2 and the first gate layer GAT1 in the first via hole V1 to the eighth via hole V8 are removed, exposing the surface of the semiconductor layer SEL. The dielectric layer ILD and the second gate insulation layer GI2 in the ninth via hole V9 are removed, exposing the surface of the first gate layer GAT1. The dielectric layer ILD in the tenth through hole V10 to the fifteenth through hole V15 is removed, exposing the surface of the second gate layer GAT2.

Figure 14:
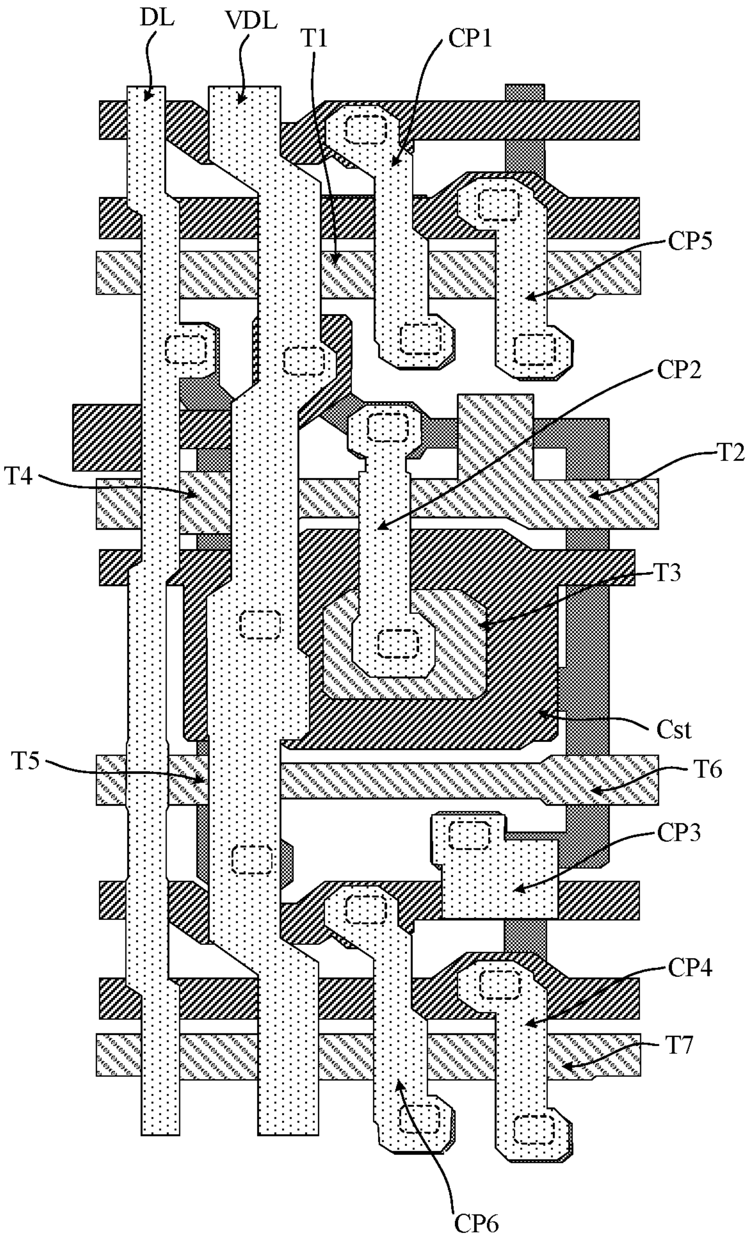
FIG. 14 is a schematic top view of the pixel circuit in the display panel according to some embodiments of the present disclosure.

As shown in FIG. 14, the first source-drain layer SD1 may include part of the signal lines SL (data line DL and power line VDL), and may also include more than one connection electrode (for example, the first connection electrode CP1 to the sixth connection electrode CP6). The data line DL may be connected to the writing transistor T4 through the third via hole V3. The power line VDL may be connected to the shielding electrode BK through the twelfth via hole V12, and may also be connected to the second electrode plate Cst2 of the storage capacitor Cst through the thirteenth via hole V13. The shielding electrode BK is used to shield the impact of the data voltage jump on the key nodes, avoiding the data voltage jump from affecting the potential of the key nodes of the pixel circuit, and improving the display effect. The first connection electrode CP1 may be connected to the first reset transistor T1 through the first via hole V1, and may also be connected to the first reset signal line INL1*a* through the tenth via hole V10. The second connecting electrode CP2 may be connected to the compensation transistor T2 through the second via hole V2, and may also be connected to the gate T31 of the driving transistor T3 through the ninth via hole V9. The third connection electrode CP3 may be connected to the second light emitting control transistor T6 through the fifth via hole V5. The fourth connection electrode CP4 may be connected to the second reset transistor T7 through the sixth via hole V6, and may also be connected to the second reset signal line INL2 through the fifteenth via hole V15. The fifth connection electrode CP5 may be connected to the second reset transistor T7 of the pixel circuit in the previous row through the seventh via hole V7, and may also be connected to the second reset signal line INL2 through the eleventh via hole V11. The sixth connection electrode CP6 may be connected to the first reset transistor T1 of the pixel circuit in the next row through the eighth via hole V8, and may also be connected to the first reset signal line INL1 through the fourteenth via hole V14.

In addition, in some embodiments of the present disclosure, the circuit layer CL of the display panel PNL may further include a second source-drain layer and a second flat layer, and the second source-drain layer may be provided on the surface of the first flat layer PLN1 away from the substrate SU. The second flat layer may cover the second source-drain layer. The data line DAL and the power line VDL may be located in the second source-drain layer. The light emitting element LD may be provided on a side of the second flat layer away from the substrate SU.

The above-mentioned pixel circuit is only an embodiment, and the pixel circuit of the present disclosure may also adopt other structures, which are not specifically limited here.

As shown in FIG. 2, the light emitting element LD may be provided on the side of the circuit layer CL away from the substrate SU, and connected to the pixel circuit. The number of the light emitting elements LD may be more than one, and the light emitting elements LD are distributed in an array.

Each light emitting element LD may be connected to a pixel circuit PC to form a pixel unit PU. The light emitting element LD may be an OLED (Organic Light Emitting Diode), a QLED (Quantum Dot Light Emitting Diode), a Micro LED or a Mini LED, etc., which can include the first electrode ANO, the second electrode CAT and the light emitting layer EL between the first electrode ANO and the second electrode CAT.

Taking OLED as an example, the first electrode ANO can be provided on the surface of the circuit layer CL away from the substrate SU, and the light emitting layer EL can include a hole injection layer, a hole transport layer, a light emitting material layer, an electron transport layer and an electron injection layer stacked along a direction away from the driving backplate BP. Each light emitting element LD can share the second electrode CAT. That is to say, the second electrode CAT can be a continuous whole layer structure, and the second electrode CAT can extend to the peripheral region, and can receive the second power signal VSS; the first electrode CAT ANO is distributed in an array to ensure that each light emitting element LD can emit light independently. In addition, in order to limit the light emitting range of the light emitting element LD and prevent crosstalk, a pixel definition layer PDL can be provided on the surface provided on the first electrode ANO, which can be provided with an opening exposing each first electrode ANO, and the light emitting layer EL can be stacked with the first electrode ANO in the opening.

Each light emitting element LD can at least share a light emitting material layer, so that the light emitting colors of each light emitting element LD are the same. At this time, in order to realize color display, a color film layer can be provided on the side of the light emitting element LD away from the substrate SU, and color display can be realized through the filter part in the color film layer corresponding to each light emitting element LD. Certainly, the light emitting material layer of each light emitting element LD can also be independent, so that the light emitting element LD can directly emit monochromatic light, and the light emitting colors of different light emitting elements LD can be different, thereby realizing color display.

In addition, as shown in FIG. 2, the display panel PNL may also include an encapsulation layer TFE covering each light emitting element LD. The encapsulation layer TFE may include a first inorganic layer TFE1 and a second inorganic layer TFE2, and an organic layer IJP between the first inorganic layer TFE1 and the second inorganic layer TFE2. The first inorganic layer TFE1 may cover the light emitting element LD. Further, the display panel PNL may also include other film layers such as a touch layer and a transparent cover provided on the side of the encapsulation layer TFE away from the substrate SU, which will not be described in detail here.

As shown in FIG. 1, in order to realize under-screen camera, a light transmitting region PAT may be provided in the display panel PNL, and the light transmitting region PAT may be all located in the display region AA, or may be partially located in the display region AA. Part of the pixel units PU are all located in the display region AA, and for any one of the other part of the pixel units PU, at least a part of it can be provided in the light transmitting region PAT, and the part of the pixel unit PU located in the light transmitting region can be defined as a functional part FP, and the functional part FP may be the pixel circuit PC of the pixel unit PU, or may be the light emitting element LD. Of course, the functional part FP may be the whole of the pixel unit PU. For this purpose, the pixel unit PU can be at least divided into a first pixel unit PU1 and a second pixel unit PU2, the first pixel unit PU1 is located in the display region AA, at least a part of each second pixel unit PU2 is located in the light transmitting region, and the part of the second pixel unit PU2 located in the light transmitting region PAT is the functional part FP.

The size of the light transmitting region PAT can match with the light-sensing element CAU, and the light transmittance is higher than that of the display region AA, so that the light transmitting region PAT can emit light for displaying images and can also transmit light for the light-sensing element to capture images. Further, more than one light transmitting region PAT can be provided, for example, the light transmitting region PAT can at least include the first light transmitting region PAT1 and the second light transmitting region PAT2, the first light transmitting region PAT 1 and the second light transmitting region Each PAT 2 are both provided with a functional part FP of the second pixel unit PU2. The light-sensing element CAU can capture images through more than one light transmitting regions PAT. As shown in FIG. 1 and FIG. 3, by making the density of the pixel units PU in the light transmitting region PAT smaller than the density of the pixel units PU in the display region AA, the blocking of light by the pixel units can be reduced, and the transmittance of the light transmitting region PAT can be improved, realizing under-screen camera; or, by compressing the size of the pixel unit PU, the blocking of light by it is reduced, thus improving the light transmittance of the light transmitting region PAT; or, the density and size of the pixel unit PU can also be reduced at the same time, improving the light transmittance of the light transmitting region.

In order to improve the imaging effect of under-screen camera, the arrangement manner of the pixel circuits PC in the first light transmitting region PAT1 and the second light transmitting region PAT2 can be complementary, so that the light-sensing element CAU can collect at least two complementary images. By synthesizing the complementary images, a clearer image can be obtained, so that the imaging effect of under-screen camera can be improved while ensuring the display effect. Of course, the arrangement manner of the light emitting elements LD in the first light transmitting region PAT1 and the second light transmitting region PAT2 may also be complementary. That is to say, the functional parts FP of the first light transmitting region PAT1 and the second light transmitting region PAT2 are complementary.

Since the pixel unit PU has a certain blocking effect on the light, the functional part FP of the first light transmitting region PAT1 and the second light transmitting region PAT2 being complementary in the context refers to that: the positions of the functional parts FP of the first light transmitting region PAT1 and the second light transmitting region PAT2 are different, so that the unblocked regions in two of the first light transmitting region PAT1 and the second light transmitting region PAT2 can be superimposed into a complete unblocked light transmitting region. The specific plan for the complementary arrangement manner of the functional parts FP in the first light transmitting region PAT1 and the second light transmitting region PAT2 will be described in detail below.

In order to facilitate the description of the distribution manner of the functional parts FP, the light transmitting region PAT can be divided into more than one sub-region SPA. The size of the range of the sub-region SPA is limited to the size of range occupied by the functional part FP. The size of the region enclosed by the boundary of the functional part FP in the second direction X and the boundary of the functional part FP in the first direction Y is the size of a sub-region SPA, so the sub-region SPA can be used to describe the arrangement manner of the functional part FP in the light transmitting region PAT. Each sub-region SPA in the light transmitting region PAT can be provided with a functional part FP, or not provided with a functional part FP. The region where the function part FP is not provided is the transmission area, and the transmittance of the transmission region is higher than that of the sub-region where the function part FP is provided, so it can be used to increase light transmittance.

The shape of each light transmitting region PAT is the shape of its orthographic projection on the substrate SU, and the shapes are all circles, etc. Of course, it can also be a triangle, a rectangle, a trapezoid or another polygon; in addition, it can also be an ellipse, waist circle and another shape. The first light transmitting region PAT1 and the second light transmitting region PAT2 may be distributed along the second direction X, and of course, may also be distributed along the first direction Y. At the same time, in order to facilitate the light-sensing element CAU to collect image, the distance between the first light transmitting region PAT1 and the second light transmitting region PAT2 can be smaller than the width of either the first light transmitting region PAT1 or the second light transmitting region PAT2 in the second direction X or the second direction X. For example, if the shape of the light transmitting region PAT is circle, the distance between the first light transmitting region PAT1 and the second light transmitting region PAT2 is smaller than the diameters of the two. Therefore, the distribution of the light transmitting regions PAT can be relatively concentrated, so that the light-sensing elements can take pictures at the same time.

In addition, the light transmitting region PAT can be provided at any position of the display region AA, for example, the display region AA is rectangular, the first light transmitting region PAT1 and the second light transmitting region PAT2 can be provided at the same corner position of the display region AA, or can be respectively provided at two corner positions, or can also be provided at other positions such as the center of the AA region. Further, the boundary of the light transmitting region PAT may partially coincide with the boundary of the display region AA, or may have a certain distance from the boundary of the display region AA.

Each light transmitting region PAT has the same shape and size, and the sub-regions SPA of each light transmitting region PAT are arranged in the same way, for example, each light transmitting region PAT includes n rows and m columns of sub-regions SPA, n and m are positive integers. At the same time, each sub-region SPA has a unique position in the light transmitting region PAT where it is located, which can be regarded as each sub-region SPA has a unique coordinate in the light transmitting region PAT where it is located, and a unique sub-region SPA can be found in each light transmitting region PAT as long as a coordinate is used.

In the light transmitting region PAT, only part of the sub-regions SPA are provided with the functional parts FP, and one functional part FP is provided in one sub-region SPA. In the first light transmitting region PAT1 and the second light transmitting region PAT2, only one of the two sub-regions SPA at the same position is provided with a functional part FP, so that the region blocked by the functional part FP in the first light transmitting region PAT1 is not blocked by the functional part FP in the second light transmitting region PAT2, and the region blocked by the functional part FP in the second light transmitting region PAT2 is not blocked by the functional part FP in the first light transmitting region PAT1. Based on this, due to the complementary arrangement of the functional parts FP in the first light transmitting region PAT1 and the second light transmitting region PAT2, the light-sensing element can collect different images of the same scene, and the image of the scene can be obtained by synthesizing the images ng the two images, which can be considered to be jointly imaged by the sub-region SPA of the functional part FP provided in the first light transmitting region PAT1 and the second light transmitting region PAT2.

Figure 5:
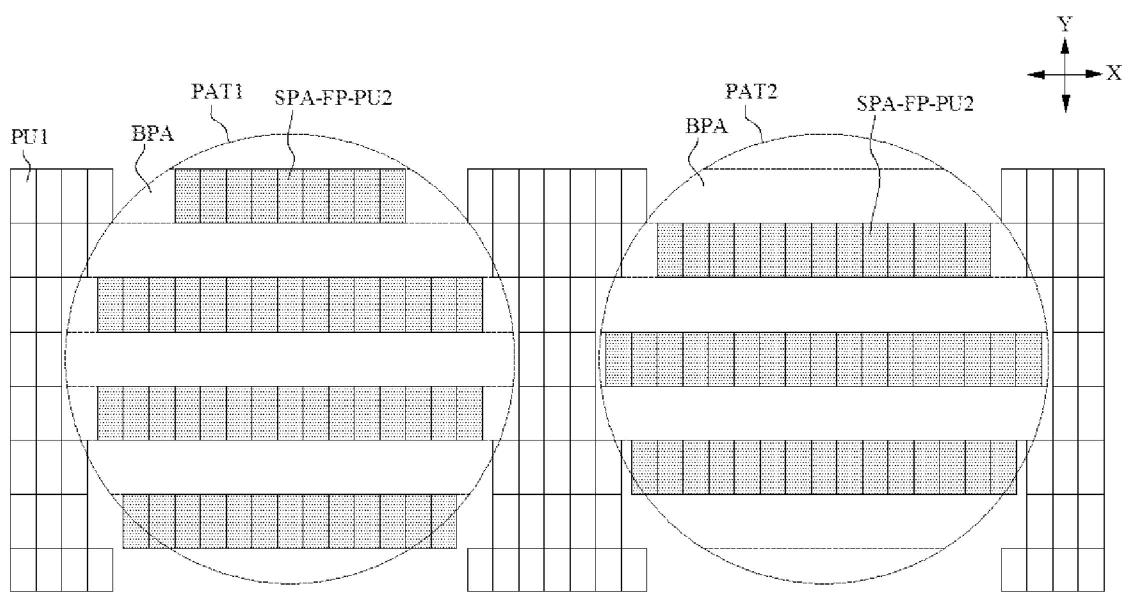
FIG. 5 is a partial schematic diagram of the display panel according to a first embodiment of the present disclosure.

As shown in FIG. 5, in the first embodiment of the present disclosure, both the first light transmitting region PAT1 and the second light transmitting region PAT2 can be divided into more than one sub-region group BPA extending along the second direction X, and each sub-region group BPA may be distributed along the first direction Y; each sub-region group BPA includes more than one sub-region SPA distributed along the second direction X, that is, the sub-region group BPA may extend along the second direction X.

Further, in order to improve the resolution of the light transmitting region, the number of functional parts FP in the light transmitting region PAT can be increased. For this reason, the size of the functional parts FP in the light transmitting region PAT can be compressed. Examples are as follows.

For description, the following definitions can be made.

The maximum distance of the boundary of the sub-region SPA in the first direction Y is its length; the maximum distance of the boundary of the sub-region SPA in the second direction X is its width.

The maximum distance of the boundary of the sub-region group BPA in the first direction Y is its width; the maximum distance of the boundary of the sub-region group BPA in the second direction X is its length.

The maximum distance of the boundary of the first pixel unit PU in the first direction Y is its length; the maximum distance of the boundary of the first pixel unit PU in the second direction X is its width.

The maximum distance of the boundary of the functional part FP in the first direction Y is its length; the maximum distance of the boundary of the functional part FP in the second direction X is its width.

In some embodiments of the present disclosure, in the first direction Y, the length of at least part of the sub-region SPA in the light transmitting region PAT can be made smaller than the length of at least a part of the first pixel unit PU1 in the display region AA, so that the length of the functional part FP in the light transmitting region PAT is smaller than the length of the first pixel unit PU1 in the display region AA, thus compressing the functional part FP in the first direction Y, to facilitate that the light transmitting region PAT can be provided with more functional units FP in the first direction Y. For example, the length of at least part of the sub-region SPA in the first light transmitting region PAT1 and the second light transmitting region PAT2 is not greater than 50% of the length of at least part of the first pixel unit PU1 in the display region AA.

In other embodiments of the present disclosure, in the second direction X, the width of the sub-region SPA in the light transmitting region PAT can be not greater than the width of at least part of the first pixel unit PU1 in the display region AA, so that the length of the functional part FP in the second direction X is smaller than the width of the first pixel unit PU1 in the display region AA, thus compressing the functional part FP of the first light transmitting region PAT1 and the second light transmitting region PAT2 in the second direction X, to facilitate that the first light transmitting region PAT1 and the second light transmitting region PAT2 are provided with more functional parts FP in the second direction X. For example, the width of the sub-region SPA in the first light transmitting region PAT1 and the second light transmitting region PAT2 is not greater than 50% of the width of at least part of the first pixel unit PU1 in the display region AA.

In other embodiments of the present disclosure, the functional part FP of the first light transmitting region PAT1 and the second light transmitting region PAT2 can be compressed along the second direction X and the first direction Y at the same time, so as to increase the number of functional parts FP the first light transmitting region PAT1 and the second light transmitting region PAT1, thus increasing the resolution of the first light transmitting region PAT1 and the second light transmitting region PAT2.

The distribution manner of the sub-region SPA of the light transmitting region PAT will be described below in more than one embodiment.

The widths of different sub-region groups BPA in the same light transmitting region PAT can be the same, but the lengths can be different. For example, the shapes of the first light transmitting region PAT1 and the second light transmitting region PAT2 are circles, and at least one sub-region group BPA extends along the radial direction of the light transmitting region PAT and passes through the center of the light transmitting region PAT, other sub-region groups BPA are symmetrically distributed along the first direction Y on both sides of the sub-region group BPA passing through the center.

Only one of the j-th sub-region SPA of the i-th sub-region group BPA in the first light transmitting region PAT1 and the second light transmitting region PAT2 is provide with the functional part FP, without being provided with the functional part FP at the same time, $i \leq n$, $j \leq m$, m and n are all positive integers.

Further, in the first light transmitting region PAT1, only at least part of the sub-regions SPA of the (2k−1)-th sub-region group BPA are provided with the functional parts FP. In the second light transmitting region PAT2, only at least part of the sub-regions SPA of the 2k-th sub-region group BPA are provided with functional parts FP, and k is a positive integer. That is to say, the functional parts FP in the first light transmitting region PAT1 are located in the odd number of sub-region groups BPA, and the functional parts FP in the second light transmitting region PAT2 are located in the even number of sub-region groups BPA, so as to realize the complementarity mentioned above.

Of course, other ways can also be used to provide the functional part FP in each sub-region group BPA, as long as complementarity can be achieved. For example, in the first direction Y, the functional part FP in the first light transmitting region PAT1 is located on its upper half, and the functional part FP in the second light transmitting region PAT2 is located on its lower half.

Figure 6:
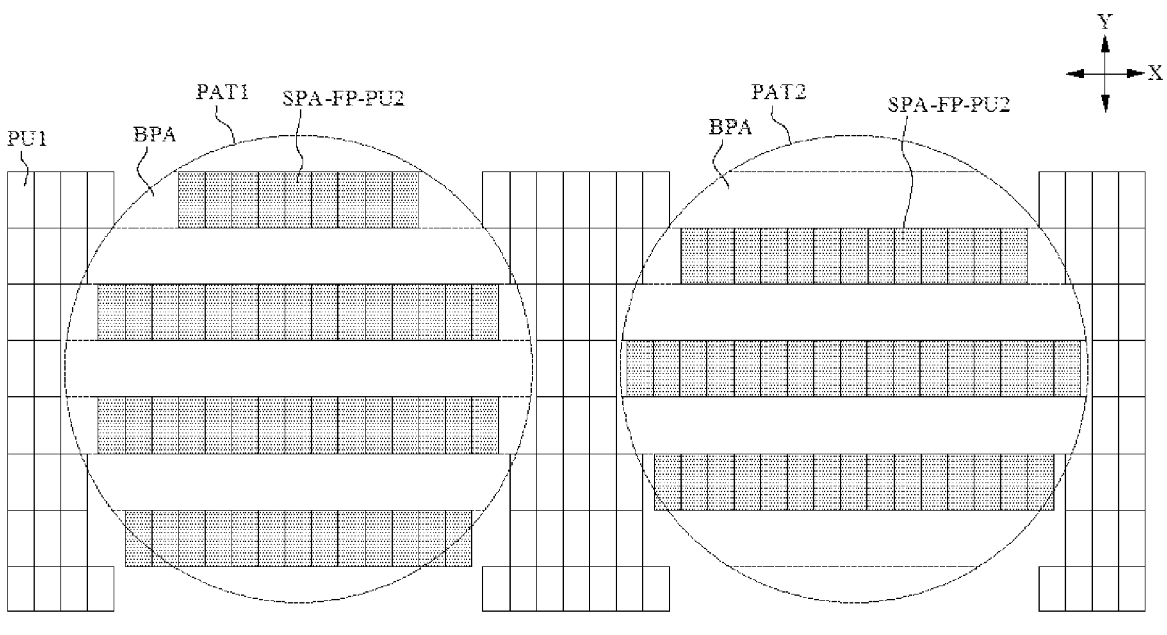
FIG. 6 is a partial schematic diagram of the display panel according to a second embodiment of the present disclosure.

As shown in FIG. 6, in the second embodiment of the present disclosure, based on the above-mentioned first embodiment, in the first direction Y, the width of a sub-region group BPA can be the same to the length of the sub-regions SPA in the display region AA, and the length of the sub-regions SPA is not greater than 50% of the length of at least part of the first pixel unit PU1, for example, 45%, 50%, etc., so that the sub-regions SPA in the same sub-region group BPA are arranged into at least two rows along the first direction Y.

For ease of description, each row of at least two rows of sub-regions SPA in the sub-regions SPA in the same sub-region group BPA can be defined as a sub-subregion group BPA, and in the same sub-region group BPA, the first sub-subregion group BPA1 and the second sub-sub region group BPA2 are at least included.

Each functional part FP in a sub-region group BPA is provided in the sub-region SPA of the first sub-subregion group BPA1 and the second sub-subregion group BPA2, and the sub-regions SPA of the first sub-subregion group BPA1 and the second sub-subregion group BPA2 are both provided with functional parts FP. The functional parts FP provided in the same row of sub-regions SPA may be provided adjacently in sequence along the second direction X, that is, two adjacent functional parts FP are provided in two adjacent sub-regions SPA. At the same time, in a sub-region group BPA provided with the functional part FP, there are more than one row of sub-region SPA, and at least part of two adjacent sub-regions SPA in the first direction Y are provided with the functional part FP, for example, the functional parts FP of the first sub-subregion group BPA1 and the second sub-subregion group BPA2 are equal in number, and are provided in a one-to-one correspondence in the first direction Y.

Figure 7:
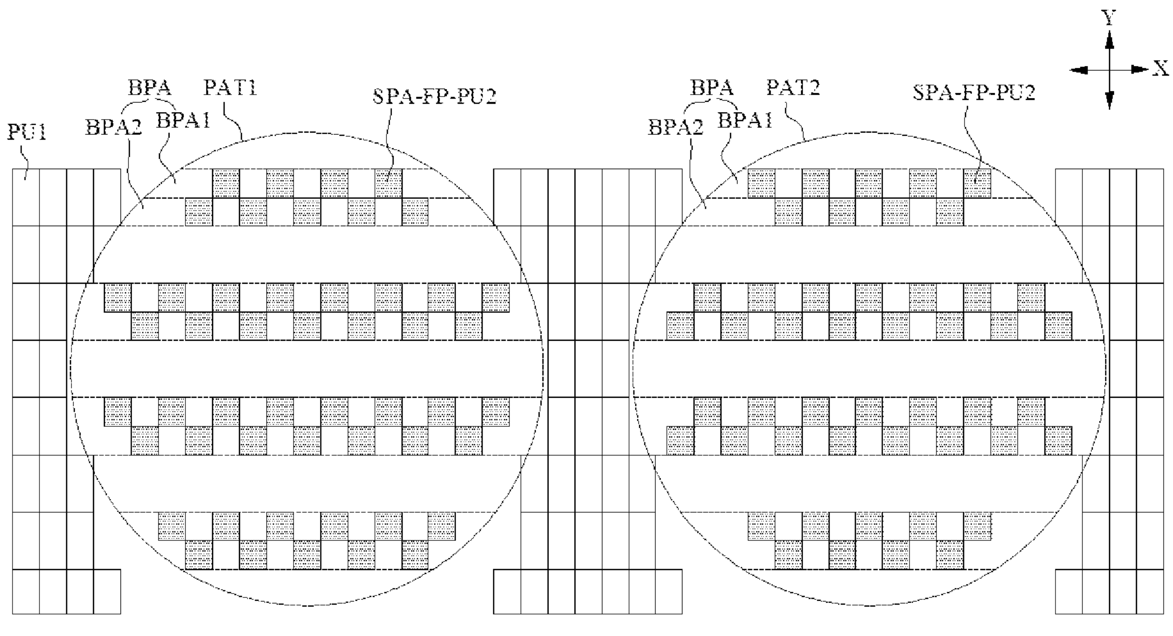
FIG. 7 is a partial schematic diagram of the display panel according to a third embodiment of the present disclosure.

As shown in FIG. 7, in a third embodiment of the present disclosure, the difference from the second embodiment is that the functional parts FP provided in the same row of sub-regions SPA can be provided at intervals, but the distribution manners of the functional parts FP in a row of sub-regions SPA at the same position in the first light transmitting region PAT1 and the second light transmitting region PAT1 may still be complementary. For example, in the same sub-region group BPA, in the second direction X, the functional parts FP of the first sub-subregion group BPA1 are alternately distributed with the functional parts FP of the second sub-region group BPA2. Further, for the two rows of sub-regions SPA at the same position in the first light transmitting region PAT1 and the second light transmitting region PAT2, in the second direction X, the odd number of sub-regions SPA of a row of sub-regions SPA in the first light transmitting region PAT1 are provided with functional parts FP, and the even number of sub-regions SPA of a row of sub-regions SPA of the second light transmitting region PAT2 are provided with functional parts FP. That is to say, in a row of sub-regions SPA provided with the functional parts FP in the first light transmitting region PAT1, the functional part FP is provided in the (2k−1)-th sub-region SPA. In a row of sub-regions SPA provided with the functional parts FP in the second light transmitting region PAT2, the functional part FP is provided in the 2k-th sub-region SPA, where k is a positive integer.

Figure 8:
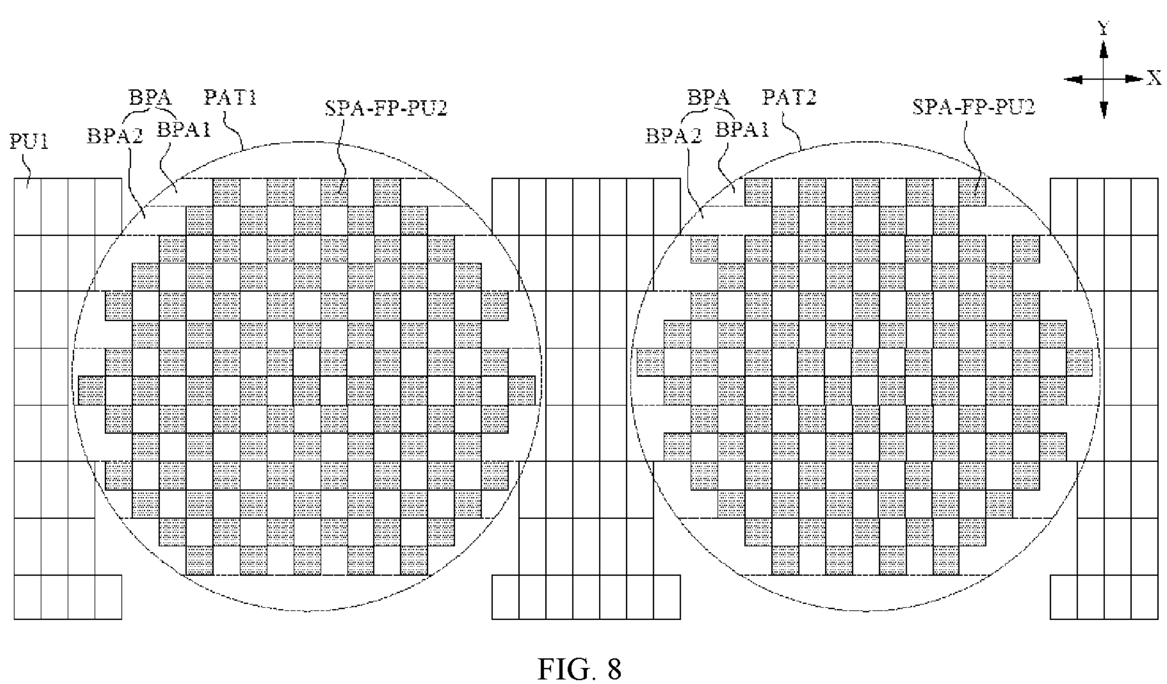
FIG. 8 is a partial schematic diagram of the display panel according to a fourth embodiment of the present disclosure.

As shown in FIG. 8, in a fourth embodiment of the present disclosure, each sub-region group BPA in the first light transmitting region PAT1 and the second light transmitting region PAT2 is provided with functional parts FP, and each row of sub-regions SPA in the same sub-region group BPA is provided with functional parts FP at intervals, so that the light transmitting sub-regions SPA and functional parts FP can be evenly dispersed and distributed, which is conducive to improving the uniformity of brightness of the light transmitting region.

Further, in a sub-region group BPA provided with functional parts FP, at most one of two sub-regions SPA adjacent in the first direction Y is provided with functional parts FP, that is, the functional parts FP are evenly distributed at intervals in the second direction X and the first direction Y, and there is at least one sub-region SPA without functional parts FP between two functional parts FP adjacent in the second direction X. For example, in a row of sub-regions SPA provided with the functional parts FP in the first light transmitting region PAT1, the functional part FP is provided in the (2k−1)-th sub-region SPA; In a row of sub-regions SPA provided with the functional parts FP in the second light transmitting region PAT2, the functional part FP is provided in the 2k-th sub-region SPA, and k is a positive integer. Between two functional parts FP adjacent in the first direction Y, there is at least one sub-region SPA without a functional part FP.

Further, in the first direction Y, the width of a sub-region group BPA can be the same as the length of at least part of the first pixel unit PU1, and the length of the sub-region SPA is not greater than 50% of the length of at least part of the first pixel unit PU1, for example, 45%, 50%, etc., so that the sub-regions SPA in the same sub-region group BPA are arranged in at least two rows along the first direction Y.

Figure 9:
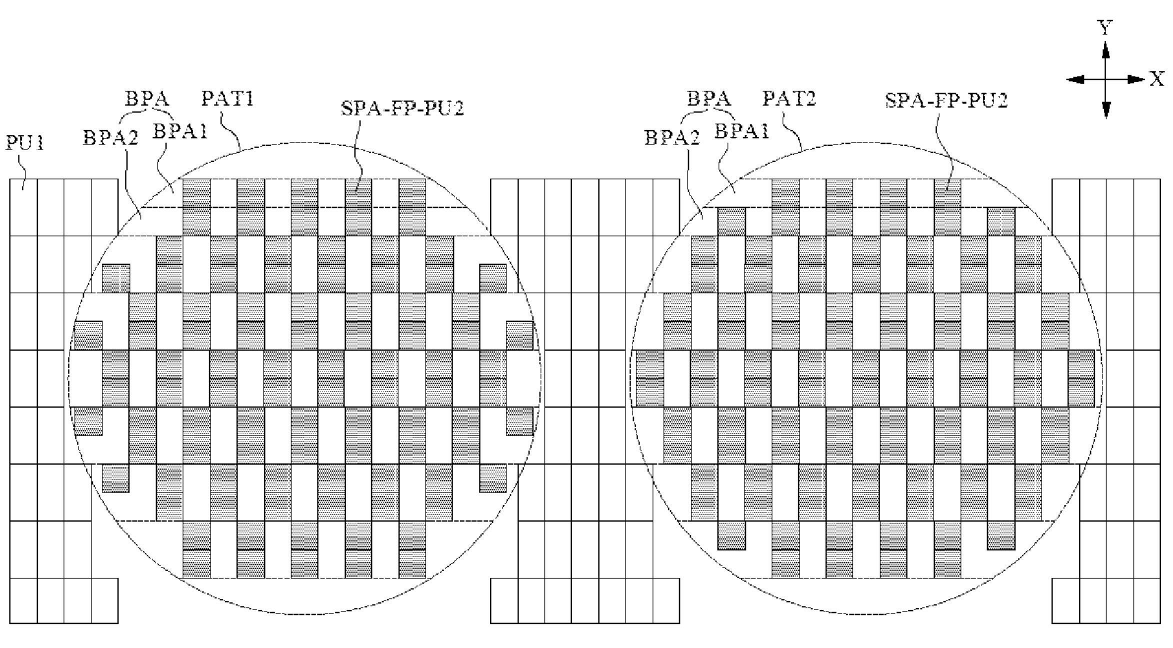
FIG. 9 is a partial schematic diagram of the display panel according to a fifth embodiment of the present disclosure.

As shown in FIG. 9, in a fifth embodiment of the present disclosure, each sub-region group BPA in any light transmitting region PAT is provided with functional parts FP, and each row of sub-regions SPA in the same sub-region group BPA is provided at intervals with functional parts FP. In the first direction Y, the width of a sub-region group BPA can be the same as the length of at least part of the first pixel units PU1, and the length of the sub-region SPA is not greater than 50% of the length of at least part of the first pixel unit PU1, for example, 45%, 50%, etc., so that the sub-regions SPA in the same sub-region group BPA are arranged in at least two rows along the first direction Y.

In a sub-region group BPA provided with the functional parts FP, at least part of the two sub-regions SPA adjacent in the first direction Y are provided with the functional parts FP. That is to say, the functional parts FP are distributed at intervals in the second direction X, but in the first direction Y, two functional parts FP in the same sub-region group BPA can be provided adjacently, that is, there is no other sub-regions SPA between them.

Figure 10:
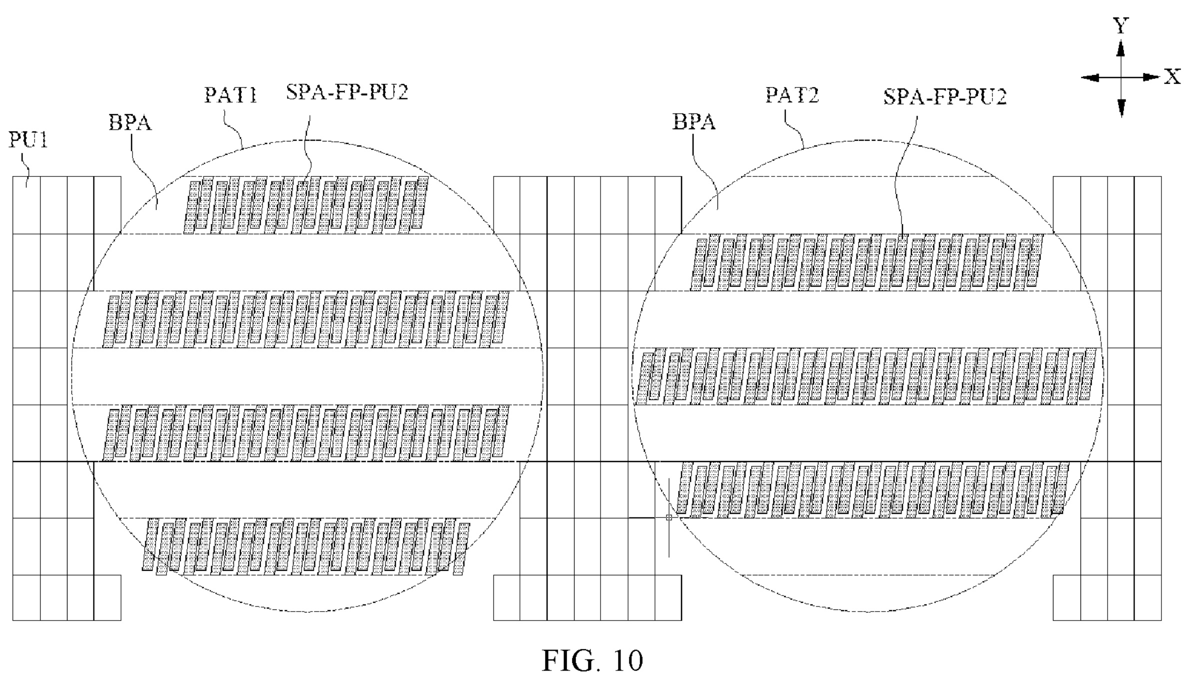
FIG. 10 is a partial schematic diagram of the display panel according to a sixth embodiment of the present disclosure.

As shown in FIG. 10, in a sixth embodiment of the present disclosure, only at least part of the sub-regions SPA of the (2k−1)th sub-region group BPA in the first light transmitting region PAT1 are provided with functional parts FP; Only at least part of the sub-regions SPA of the 2k-th sub-region group BPA in the second light transmitting region PAT2 are provided with functional parts FP; and k is a positive integer. The arrangement manner of the functional parts FP in this embodiment is similar to that in the second embodiment, and the difference is that in this embodiment, the sub-regions SPA in the same sub-region group BPA are arranged in at least two rows along the first direction Y, and the two adjacent rows of sub-regions SPA are staggered in the first direction Y, that is, two adjacent rows of sub-regions SPA partially overlap in the second direction X, that is to say, all sub-regions SPA in the same sub-region group BPA are distributed along the second direction X, and two rows of sub-regions SPA are alternately distributed along the second direction X, and there is a partial region of a sub-region SPA located in another row between two adjacent sub-regions SPA in the same row, thus realizing staggering in the second direction X.

Further, in the second direction X, the width of a sub-region group BPA can be the same as the length of at least part of the first pixel units PU1, and the length of the sub-region SPA is greater than 50% of the length of at least part of the first pixel units PU1, but less than the length of at least part of the first pixel units PU1, for example, 75%, 80%, etc., so as to provide two rows of sub-regions SPA in the above-mentioned staggering manner.

Further, the shape of the sub-region SPA may be a parallelogram with two sides extending along the second direction X and two sides forming a specified included angle with the first direction Y, and the specified included angle is an acute angle. Correspondingly, the boundary of the functional part FP provided in the sub-region SPA of this embodiment may be a parallelogram. Compared with the rectangular sub-region SPA, the sub-region SPA of this embodiment may be regarded to be inclined, which is conducive to improving space utilization rate.

Figure 11:
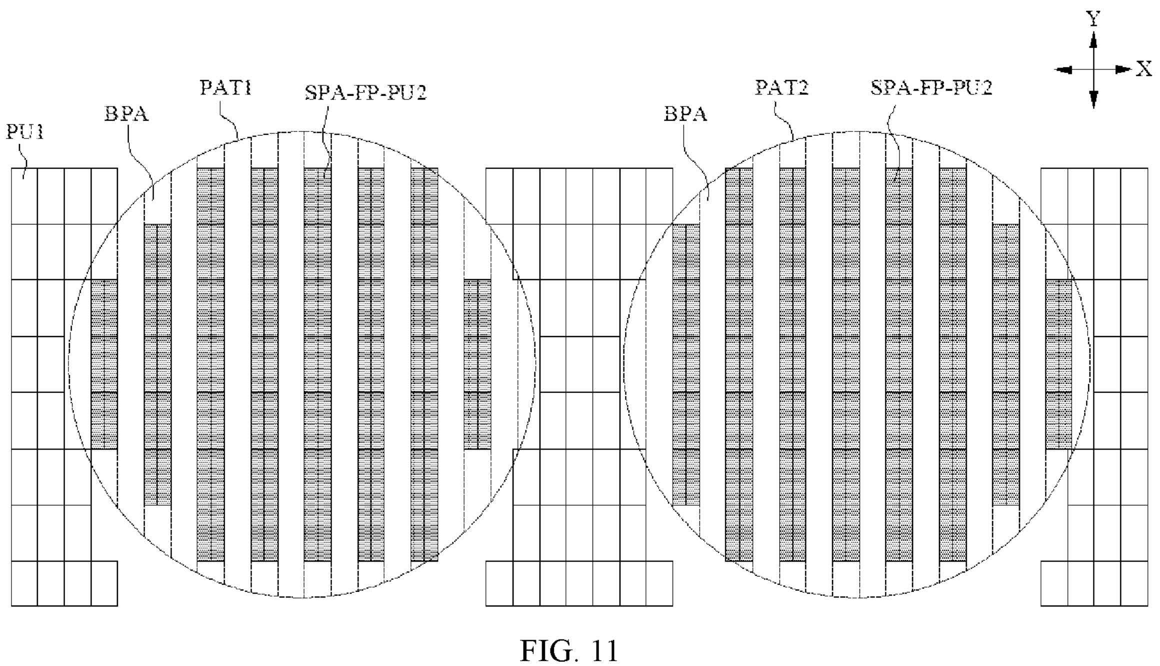
FIG. 11 is a partial schematic diagram of the display panel according to a seventh embodiment of the present disclosure.

As shown in FIG. 11, in a seventh embodiment of the present disclosure, the light transmitting region PAT can be divided into more than one sub-region groups BPA extending along the first direction Y, and each sub-region group BPA is distributed along the second direction X; each sub-region group BPA includes more than one sub-region SPA distributed along the first direction Y. The sub-region group BPA in this embodiment can refer to the sub-region group BPA in the second embodiment above, and the main difference is that the extension direction of the sub-region group BPA is different.

In order to realize the complementary arrangement of functional parts FP in this embodiment, only at least part of the sub-regions SPA of the (2k−1)-th sub-region group BPA in the first light transmitting region PAT1 can be provided with functional parts FP, and only at least part of sub-regions SPA of the 2k-th sub-region group BPA in the second light transmitting region PAT2 are provided with functional parts FP, and k is a positive integer, that is, only an odd number of sub-region groups BPA in the first light transmitting region PAT1 are provided with functional parts FP, and only an even number of sub-region groups BPA in the second light transmitting region PAT2 are provided with functional parts FP.

Further, the width of the sub-region SPA in the first light transmitting region PAT1 and the second light transmitting region PAT2 is not greater than 50% of the width of at least part of the first pixel unit PU1. The sub-regions SPA in the same sub-region group BPA are arranged in at least two columns along the second direction X, and each sub-region SPA in a column of sub-regions SPA can be distributed along the first direction Y, so as to increase the number of functional parts FP without reducing the light transmittance, thus increasing the resolution of the light transmitting region. Two adjacent columns of functional parts FP of the same sub-region group BPA can be arranged in one-to-one correspondence along the second direction X; Or, the functional parts FP are distributed at intervals in the second direction X and the first direction Y, and there is at least one sub-region SPA without functional parts FP between two adjacent functional parts FP in the second direction X, and there is at least one sub-region SPA without functional parts FP between two adjacent functional parts FP in the first direction Y.

It should be noted that the above-mentioned first to seventh embodiments are mainly for the description of the first light transmitting region PAT1 and the second light transmitting region PAT2. In some embodiments of the present disclosure, the display panel PNL may have three or more light transmitting regions PAT, as long as there are at least two complementary light transmitting regions PAT, and other light transmitting regions PAT can adopt the same arrangement manner of the functional parts FP as the two complementary light transmitting regions PAT. Of course, it can also be different, and is not specifically limited here.

Figure 12:
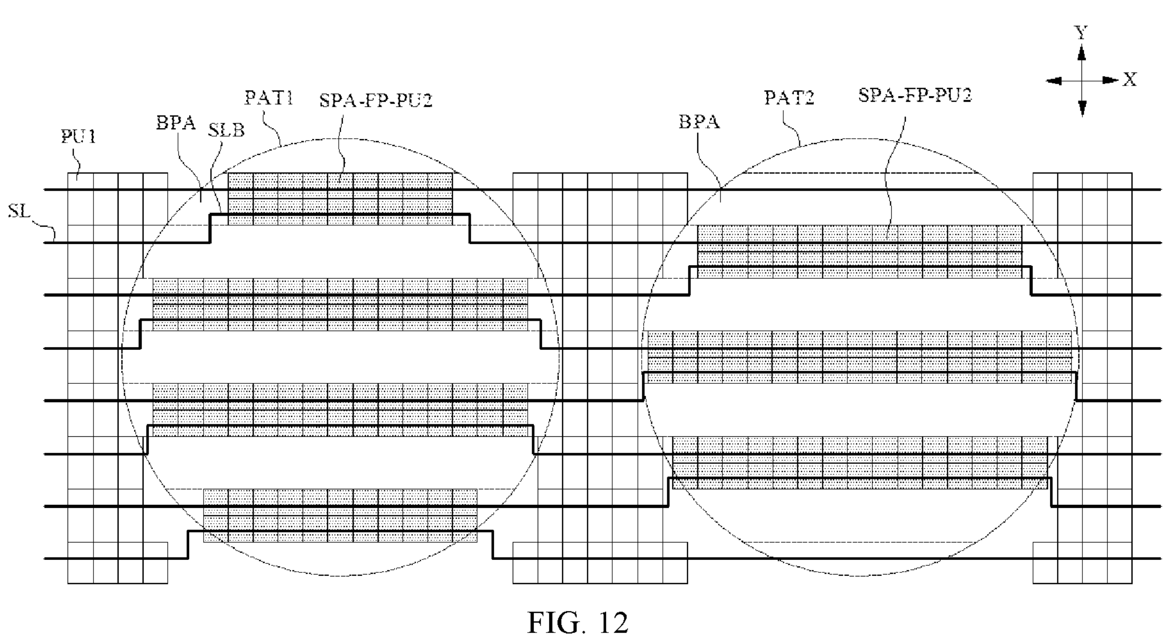
FIG. 12 is a schematic diagram of the pixel circuit and the signal line of the display panel according to the present disclosure.

As shown in FIG. 12, based on the display panel PNL mentioned above, the functional part FP of the second pixel unit PU2 can be the second pixel unit PU2 itself, and the second pixel unit PU2 is located in the first light transmitting region PAT1 and the second light transmitting region PAT2. Part of the signal lines SL connected to the pixel circuit PC of the first pixel unit PU1 in the display region AA can pass through at least one light transmitting region PAT along the second direction X, and a signal line SL is connected to the pixel circuits PC of at least one row of first pixel units PU1 in the display region AA and the pixel circuits PC of at least one row of second pixel units PU2 in the light transmitting region PAT, so that the row of second pixel units PU2 in the light transmitting region PAT can be driven by the same signal line SL. For example, the first light transmitting region PAT1 and the second light transmitting region PAT2 can be distributed along the second direction X, and part of signal lines SL can pass through the first light transmitting region PAT1 and the second light transmitting region PAT2 in sequence, and connect with the pixel circuits PC of at least one row of second pixel units PU2 in the light transmitting region PAT1 and the second light transmitting region PAT2.

As shown in FIG. 12, in some embodiments of the present disclosure, if there is a sub-region group BPA extending along the second direction X, and one sub-region group BPA includes at least two rows of sub-regions SPA, and each row of sub-regions SPA in the same sub-region group BPA are provided with functional parts FP, such as the first to fourth embodiments above, part of the signal lines SL can be bent along the first direction Y, so that each row of pixel circuits PC in the light transmitting region PAT can be connected to a signal line SL. Specifically, at least one signal line SL may be provided with a bending part bent along the first direction Y, and the bending part is located in the light transmitting region and connected to at least one row of pixel circuits PC in the light transmitting region. The bending part may include a connection part extending in the second direction X and an extension part connected to two ends of the connection part, and the extension part may extend along the first direction Y.

Taking the above 7T1C pixel circuit PC as an example, the above-mentioned signal lines SL may include one or more of the scanning line GL, the first reset control line REL1, the second reset control line REL2, the first reset signal line INL1 and the second reset signal line INL2. In some embodiments, any signal line SL extending along the second direction X and connected to any row of pixel circuits PC of the second pixel unit PU2 in the light transmitting region PAT is connected to a row of pixel circuits PC located in the first pixel unit PU1 at the same time.

Figure 13:
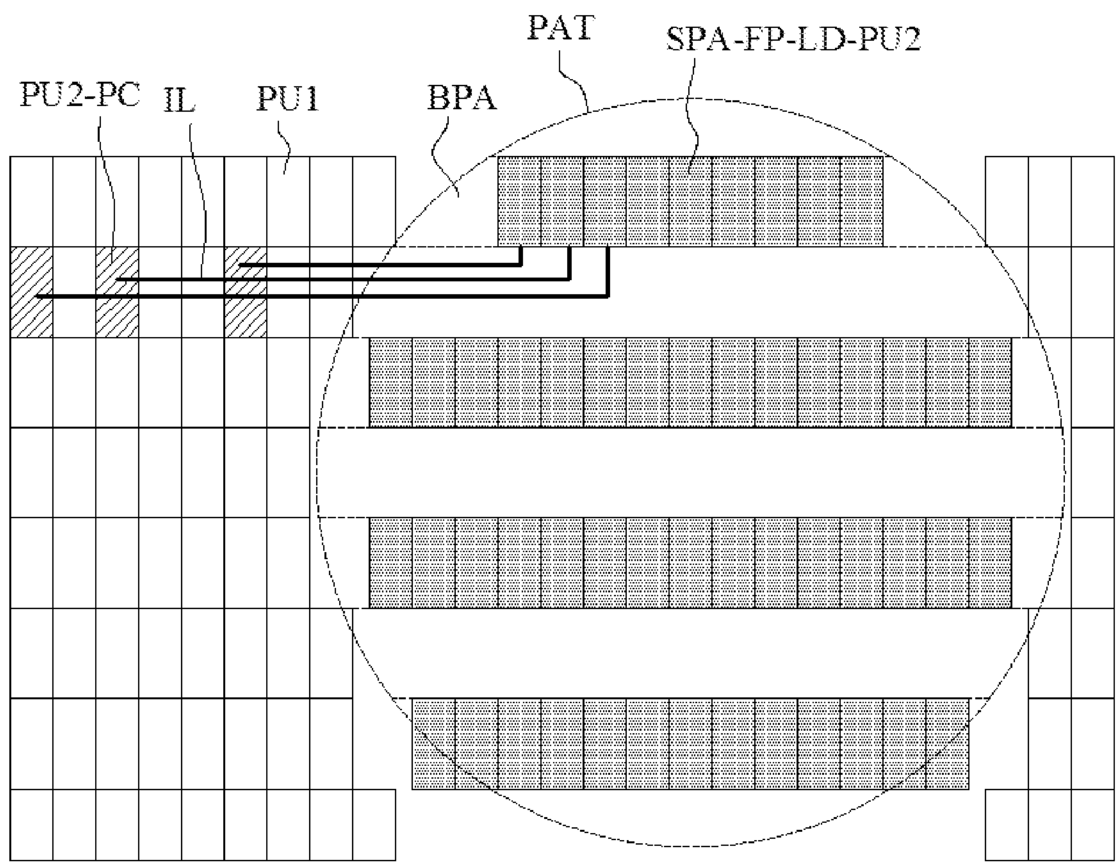
FIG. 13 is a schematic diagram of the conductive line of the display panel according to some embodiments of the present disclosure.

As shown in FIG. 13, in some embodiments of the present disclosure, the light emitting element LD of the second pixel unit PU2 is located in the light transmitting region PAT, and the pixel circuit PC of the second pixel unit PU2 and the first pixel unit PU1 are both located in the display region AA. That is, the functional part FP is the light emitting element LD of the second pixel unit PU2. The pixel circuit PC and the light emitting element LD of the second pixel unit PU2 can be connected by a conductive line IL, and the conductive line IL extends from the display region AA into the light transmitting region PAT, that is, the second pixel unit PU2 can also include a conductive line IL connecting the pixel circuit PC and the light emitting element LD. At the same time, in order to prevent the conductive line IL from having a great influence on the light transmittance, the material of the conductive line IL may be a transparent conductive material such as ITO (Indium Tin Oxide).

In addition, the conductive line IL can be provided between the light emitting element LD and the pixel circuit PC, and the conductive lines IL of different second pixel units PU2 can be located on different layers, that is, more than one layer of transparent conductive material layer can be provided, and two adjacent layers are separated by insulation material. Each layer may be provided with conductive lines IL. Of course, each the conductive line IL can also be located on the same layer.

In order to accommodate the pixel circuit PC of the second pixel unit PU2 in the display region AA, a part of the pixel circuits PC of the first pixel unit PU1 can be compressed so that the width of a part of the pixel circuits PC of the first pixel unit PU1 is smaller than the width of the other part the pixel circuits PC of the first pixel unit PU1, thus leaving space for the pixel circuit PC of the second pixel unit PU2.

Of course, all the pixel circuits PC of the first pixel unit PU1 can also be compressed along the second direction X, as long as the display region AA can accommodate the pixel circuits PC of the second pixel unit PU2. In addition, part of the pixel circuits PC of the second pixel unit PU2 can also be provided in the peripheral region WA of the display panel PNL.

It should be noted that only part of the second pixel units PU2 and their conductive lines IL are shown in FIG. 13, and the lining manner of the conductive lines IL of other second pixel units PU2 can refer to the manner in FIG. 13, but is not limited to this, as long as the pixel circuit PC located in the display region AA and the light emitting element LD located in the light transmitting region PAT can be connected together.

Embodiments of the present disclosure also provide a terminal device, which may be a mobile phone, a tablet computer, a television, or other electronic devices with an under-screen camera function, which will not be listed here. As shown in FIG. 1, the terminal device of the present disclosure may include a display panel PNL and a light-sensing element CAU, where:

The display panel PNL may be the display panel PNL in any of the above-mentioned embodiments, and its structure can refer to the embodiments of the driving backplate BP and the display panel PNL above, and will not be described in detail here.

The light-sensing element CAU can be provided on the side of the substrate SU away from the pixel unit PU, and the orthographic projection of the light-sensing element CAU on the substrate SU at least partially overlaps with the orthographic projection of the light transmitting region PAT on the substrate SU.

In some embodiments of the present disclosure, there are more than one light-sensing element CAU, which may include a first light-sensing element CAU1 and a second light-sensing element CAU2, and the first light-sensing element CAU1 and the first light transmitting region PAT1 are provided in one-to-one correspondence. For example, the orthographic projection of the first light transmitting region PAT1 on the substrate SU at least partially overlaps with the orthographic projection of the first light-sensing element CAU on the substrate SU, so that images can be collected through the first light transmitting region PAT1. The orthographic projection of the second light transmitting region PAT2 on the substrate SU at least partially overlaps with the orthographic projection of the second light-sensing element CAU2 on the substrate SU, so that images can be collected through the second light transmitting region PAT2.

External light can be irradiated on the corresponding first light-sensing element CAU1 and the second light-sensing element CAU2 through the light transmitting region PAT, and the first light-sensing element CAU1 and the second light-sensing element CAU2 can generate electrical signals according to the transmitted light of the corresponding light transmitting region PAT, so as to generate an image. The first light-sensing unit CAU1 and the second light-sensing unit CAU2 may include image sensors, such as CCD image sensors or CMOS image sensors.

No special limitation is made here. The first light-sensing unit CAU1 and the second light-sensing unit CAU2 can collect images independently, that is, the electrical signals generated by the first light-sensing unit CAU1 and the second light-sensing unit CAU2 can be both used to form a complete image.

In addition, in order to synthesize the images taken by the light-sensing element CAU from more than one light transmitting region PAT and finally obtain a clearer image, the terminal device may further include a processor, which may connect with the first light-sensing element CAU1 and the second light-sensing element CAU2 of the light-sensing element CAU. The information collected by each of the first light-sensing element CAU1 and the second light-sensing element CAU2 is processed to synthesize an image. Taking the terminal device being a mobile phone as an example, the processor may be a processor on the main board of the mobile phone, or an independent processor specially provided for image processing.

For example, the arrangement manner of the functional parts FP in the first light transmitting region PAT1 and the second light transmitting region PAT2 is complementary, and correspondingly, the light-transmissible sub-regions SPA of the two are complementary, so that the blocked regions by the first light-sensing element CAU1 and the second light-sensitive element CAU2 are complementary, and a clear image can be synthesized through electrical signals obtained from respective unblocked regions of the first light-sensing element CAU1 and the second light-sensing element CAU2. The electrical signals of the blocked and unblocked regions of the first light-sensing element CAU1 and the second light-sensing element CAU2 can be judged by the strength of the electrical signal (such as voltage or current). The specific manner of image synthesis is not particularly limited here.

The light-sensing element CAU can generate images based on visible light, and can also generate images based on infrared rays or other light rays. For example, the light-sensing element CAU can include an infrared sensor to form an infrared image by receiving infrared rays from the outside, so as to identify fingerprint patterns, iris patterns, facial patterns, etc., according to the infrared image. Alternatively, the light-sensing unit CAU may further include an illuminance sensor that may measure illuminance around the terminal device, and the display panel PNL may adjust brightness of the display panel based on the measured illuminance. In addition, the light-sensing element CAU may also adopt a light detection and ranging (LIDAR) sensor or the like.

The light-sensing element CAU can be used not only for cameras that take images, but also for small lamps that measure distance by outputting and detecting light, and output light.

Other embodiments of the present disclosure will be readily apparent to those skilled in the art from consideration of the description and practice of the present disclosure. The present disclosure is intended to cover any modification, use or adaptation of the present disclosure, and these modifications, uses or adaptations follow the general principles of the present disclosure and include common knowledge or conventional technical means in the technical field not disclosed in the present disclosure. The description and examples are to be considered as examples only, with the true scope and spirit of the present disclosure indicated by the appended claims.

What is claimed is:

1. A display panel, wherein the display panel is provided with more than one light transmitting region and a display region located outside the more than one light transmitting region; the light transmitting region comprises a first light transmitting region and a second light transmitting region;

the display panel comprises:

a substrate;

more than one pixel unit, provided on a side of the substrate and comprising more than one first pixel unit and more than one second pixel unit; wherein, the first pixel unit is located in the display region, the second pixel unit is at least partially located in the light transmitting region, and a part of the second pixel unit located in the light transmitting region is a functional part; the first light transmitting region and the second light transmitting region are both provided with more than one functional part;

wherein, the first light transmitting region and the second light transmitting region both comprise n sub-region groups arranged along a first direction, and a sub-region group comprises m sub-regions arranged along a second direction, and the first direction intersects the second direction;

only one of a j-th sub-region in an i-th sub-region group in the first light transmitting region and the second light transmitting region is provided with the functional part, $i \leq n$, $j \leq m$, m and n are both positive integers, wherein the functional part in the first light transmitting region is in a complementary arrangement with the functional part in the second light transmitting region.

2. The display panel according to claim 1, wherein the functional part in the first light transmitting region is located in an odd number of sub-region groups, and the functional part in the second light transmitting region is located in an even number of sub-region groups.

3. The display panel according to claim 1, wherein at least one sub-region group comprises a first sub-subregion group and a second sub-subregion group arranged along the first direction, the first sub-subregion group and the second sub-subregion group both comprise more than one sub-region arranged along the second direction;

the functional part in the sub-region group is provided in the sub-regions of the first sub-subregion group and the second sub-region group, and the sub-regions of the first sub-subregion group and the second sub-subregion group are both provided with the functional part.

4. The display panel according to claim 1, wherein the sub-region group comprises a first sub-subregion group and a second sub-subregion group arranged along the first direction, and the first sub-subregion group and the second sub-subregion group both comprise more than one sub-region arranged along the second direction;

the functional part in the sub-region group is provided in the sub-regions of the first sub-subregion group and the second sub-subregion group, and the functional part of the first sub-subregion group is distributed at intervals, the functional part of the second sub-subregion group is distributed at intervals.

5. The display panel according to claim 4, wherein, in the second direction, the functional part of the first sub-subregion group is distributed alternately with the functional part of the second sub-subregion group.

6. The display panel according to claim 4, wherein, in the first direction, the functional part of the first sub-subregion group is provided in one-to-one correspondence with the functional part of the second sub-subregion group.

7. The display panel according to claim 6, wherein the functional part of the first sub-subregion group and the second sub-subregion group in the first light transmitting region is provided in an odd number of sub-regions, and the functional part of the first sub-subregion group and the second sub-subregion group in the second light transmitting region is provided in an even number of sub-regions.

8. The display panel according to claim 1, wherein the sub-regions of the sub-region group provided with the functional part are arranged in at least two rows along the second direction, and two adjacent rows of the sub-regions are staggered in the first direction.

9. The display panel according to claim 8, wherein a shape of a sub-region is a parallelogram with two sides extending along the first direction and two sides forming a specified included angle with the second direction, and the specified included angle is an acute angle.

10. The display panel according to claim 1, wherein the pixel unit comprises a pixel circuit and a light emitting element provided along a direction away from the substrate, and the pixel circuit is used to drive the light emitting element to emit light; a pixel circuit and a light emitting element of the first pixel unit are both located in the display region, and a pixel circuit and a light emitting element of the second pixel unit are both located in the light transmitting region; the second pixel unit is the functional part.

11. The display panel according to claim 1, wherein, in the second direction, a length of at least part of the sub-regions in the light transmitting region is smaller than a length of the pixel unit in the display region.

12. The display panel according to claim 1, wherein in the first direction, a width of at least part of the sub-regions in the light transmitting region is smaller than a length of the pixel unit in the display region.

13. The display panel according to claim 1, wherein the pixel unit comprises a pixel circuit and a light emitting element provided along a direction away from the substrate, and the pixel circuit is used to drive the light emitting element to emit light;

a pixel circuit of the second pixel unit is located in the display region, a light emitting element of the second pixel unit is the functional part, and the functional part is connected to the pixel circuit through a conductive line.

14. The display panel according to claim 13, wherein a width of a part of a pixel circuit of the first pixel unit in the second direction is smaller than a width of another part of the pixel circuit of the first pixel unit in the second direction.

15. The display panel according to claim 13, wherein the conductive line is provided between the pixel circuit and the light emitting element, and extends from the light transmitting region to the display region.

16. The display panel according to claim 1, wherein a j-th sub-region in an i-th sub-region group of the first light transmitting region is provided with the functional part, and a j-th sub-region in an i-th sub-region group of the second light transmitting region is a transmission region.

17. A display panel, wherein the display panel is provided with more than one light transmitting region and a display region located outside the light transmitting region; the light transmitting region comprises a first light transmitting region and a second light transmitting region;

the display panel comprises:

a substrate;

more than one pixel unit, provided on a side of the substrate and comprising more than one first pixel unit and more than one second pixel unit; wherein, the first pixel unit is located in the display region, the second pixel unit is at least partially located in the light transmitting region, and a part of the second pixel unit located in the light transmitting region is a functional part; the first light transmitting region and the second light transmitting region are both provided with more than one functional part;

wherein, the first light transmitting region and the second light transmitting region both comprise more than one sub-region, and the sub-region of the first light transmitting region and the sub-region in the second light transmitting region are both arranged in a same manner; the functional part in the light transmitting region is located in a part of the sub-region;

in the first light transmitting region and the second light transmitting region, only one of two sub-regions arranged at a same position is provided with the functional part, wherein the functional part in the first light transmitting region is in a complementary arrangement with the functional part in the second light transmitting region.

18. A terminal device, comprising:

a display panel, provided with more than one light transmitting region and a display region located outside the more than one light transmitting region; wherein the light transmitting region comprises a first light transmitting region and a second light transmitting region;

the display panel comprises:

a substrate;

more than one pixel unit, provided on a side of the substrate and comprising more than one first pixel unit and more than one second pixel unit; wherein, the first pixel unit is located in the display region, the second pixel unit is at least partially located in the light transmitting region, and a part of the second pixel unit located in the light transmitting region is a functional part; the first light transmitting region and the second light transmitting region are both provided with more than one functional part;

wherein, the first light transmitting region and the second light transmitting region both comprise n sub-region groups arranged along a first direction, and a sub-region group comprises m sub-regions arranged along a second direction, and the first direction intersects the second direction;

only one of a j-th sub-region in an i-th sub-region group in the first light transmitting region and the second light transmitting region is provided with the functional part, $i \leq n$, $j \leq m$, m and n are both positive integers, wherein the functional part in the first light transmitting region is in a complementary arrangement with the functional part in the second light transmitting region; and a light-sensing element, located on a side of the substrate away from the more than one pixel unit, wherein an orthographic projection of the light-sensing element on the substrate at least partially overlaps with an orthographic projection of the light transmitting region on the substrate.

19. The terminal device according to claim 18, wherein the light-sensing element comprises a first light-sensing element and a second light-sensing element, and an orthographic projection of the first light-sensing element on the substrate at least partially overlaps with an orthographic projection of the first light transmitting region on the substrate;

an orthographic projection of the second light-sensing element on the substrate at least partially overlaps with an orthographic projection of the second light transmitting region on the substrate.

20. A terminal device, comprising:

the display panel according to claim 17; and a light-sensing element, located on a side of the substrate away from the more than one pixel unit, wherein an orthographic projection of the light-sensing element on the substrate at least partially overlaps with an orthographic projection of the light transmitting region on the substrate.

* * * * *